(12) United States Patent
Lee et al.

(10) Patent No.: US 12,720,956 B2
(45) Date of Patent: Aug. 25, 2026

(54) DISPLAY DEVICE

(71) Applicant: Samsung Display Co., Ltd., Yongin-Si (KR)

(72) Inventors: Sungeun Lee, Yongin-si (KR); Youn Joon Kim, Yongin-si (KR); Jinho Ju, Yongin-si (KR); Jonghyun Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 468 days.

(21) Appl. No.: 18/220,098

(22) Filed: Jul. 10, 2023

(65) Prior Publication Data

US 2024/0164140 A1 May 16, 2024

(30) Foreign Application Priority Data

Nov. 10, 2022 (KR) ........................ 10-2022-0149111

(51) Int. Cl.
*H10K 59/121* (2023.01)
*H10K 59/131* (2023.01)
*H10K 102/00* (2023.01)

(52) U.S. Cl.
CPC ....... *H10K 59/1213* (2023.02); *H10K 59/131* (2023.02); *H10K 2102/311* (2023.02)

(58) Field of Classification Search
CPC ............. H10K 59/1213; H10K 59/131; H10K 2102/311; H10K 59/124; H10K 50/805; H10K 59/126; H10K 59/12; H10K 59/1315; G09G 3/3233
See application file for complete search history.

(56) References Cited

U.S. PATENT DOCUMENTS

| | | | |
|---|---|---|---|
| 9,564,477 B2 | 2/2017 | Kim | |
| 10,127,879 B2 | 11/2018 | Ahn et al. | |
| 10,868,096 B2 | 12/2020 | Park et al. | |
| 10,978,538 B2 | 4/2021 | Wang et al. | |
| 11,367,770 B2 | 6/2022 | Park et al. | |
| 2019/0027546 A1* | 1/2019 | Lee | H10K 59/123 |

(Continued)

FOREIGN PATENT DOCUMENTS

| | | |
|---|---|---|
| KR | 10-2014-0143637 A | 12/2014 |
| KR | 10-2019-0104091 A | 9/2019 |

(Continued)

*Primary Examiner* — Chad M Dicke
*Assistant Examiner* — Gary Abel
(74) *Attorney, Agent, or Firm* — Innovation Counsel LLP

(57) ABSTRACT

A display device includes a base layer, a lower inorganic layer, a pixel circuit unit including a first pixel circuit and a second pixel circuit each of which has semiconductor patterns, inorganic layers in which contact-holes are defined, first connection electrodes disposed in the contact-holes to be connected to corresponding semiconductor patterns, a first organic layer covering the first connection electrodes, a first light emitting element connected to the first pixel circuit, and a second light emitting element connected to the second pixel circuit, wherein a valley hole, which does not overlap the contact-holes on a plane and a portion of which exposes the lower inorganic layer, is defined in the inorganic layers, and the first organic layer is disposed in the portion of the valley hole to be in contact with the lower inorganic layer.

20 Claims, 18 Drawing Sheets

(56) References Cited

U.S. PATENT DOCUMENTS

| | | | | |
|---|---|---|---|---|
| 2019/0115407 | A1* | 4/2019 | Cho | H10D 86/411 |
| 2020/0144349 | A1* | 5/2020 | Lee | H10K 59/131 |
| 2020/0328267 | A1* | 10/2020 | Li | H10K 77/111 |
| 2021/0181879 | A1* | 6/2021 | Kim | H10K 59/40 |
| 2021/0202633 | A1* | 7/2021 | Song | G09G 5/00 |
| 2024/0130173 | A1* | 4/2024 | Ke | H10K 59/124 |

FOREIGN PATENT DOCUMENTS

| | | | |
|---|---|---|---|
| KR | 10-2020-0029103 | A | 3/2020 |
| KR | 10-2145391 | B1 | 8/2020 |
| KR | 10-2021-0010717 | A | 1/2021 |

* cited by examiner

DM
DP
CFL
ISL
TFE
DP-OL
DP-CL
OC
100
BM
93
92
91
83
82
81
PDL
73
72
71
60
50
40
30
20
10
BFL
BL
AA
NPXA
PXA
NPXA
CNE3
CNE2
CNE1
SCL
CH-73
CH-72
CH-71
VA-H
CH1
VA-H
OLED
CE
ECL
EML
HCL
AE
UE
D1
G1
A1
S1
T1
BML1
BML2
D3
G3
A3
S3
T3
OP
MS2
MS1
VA-H

DM-A
DP
CFL
ISL
TFE
DP-OL
DP-CL
OC
100
BM
93
92
91
83
82
81
PDL
73
72
71
60
50
40
30
20
10
BFL
BL
AA
NPXA
PXA
VA-H3
CNE3
CNE2
CNE1
SCL
CH1
CH-73
CH-72
CH-71
OLED
CE
ECL
EML
HCL
AE
BML1
D1
G1
A1
S1
T1
UE
VA-H2
D3
G3
A3
S3
T3
BML2
OP
MS2
MS1
VA-H1

DISPLAY DEVICE

CROSS-REFERENCE TO RELATED APPLICATIONS

This U.S. non-provisional patent application claims priority under 35 U.S.C. § 119 of Korean Patent Application No. 10-2022-0149111, filed on Nov. 10, 2022, the entire contents of which are hereby incorporated by reference.

BACKGROUND

The present disclosure relates to a display device. More specifically, the present disclosure relates to a display device with improved durability.

A display device is activated by an electrical signal. The display device can be composed of various layers such as a display panel for displaying an image, or an input sensing layer for sensing an external input. The display devices may be electrically connected to each other by variously arranged signal lines.

SUMMARY

The present disclosure provides a display device including a display panel with improved durability.

An embodiment of a display device includes a base layer, a lower inorganic layer disposed on the base layer, a pixel circuit unit disposed on the lower inorganic layer and including a first pixel circuit and a second pixel circuit each of which has semiconductor patterns and conductive patterns, inorganic layers disposed on the lower inorganic layer and having contact-holes exposing the semiconductor patterns, first connection electrodes disposed in the contact-holes and on the inorganic layers, the first connection electrodes connected to the semiconductor patterns, and disposed on the inorganic layers, a first organic layer disposed on the inorganic layers and at least partially covering the first connection electrodes, a first light emitting element connected to the first pixel circuit by a first connection electrode of the first pixel circuit, and a second light emitting element connected to the second pixel circuit by a corresponding first connection electrode of the second pixel circuit, wherein a valley hole through the inorganic layers exposes the lower inorganic layer, the valley hole does not overlap the contact holes in a plan view, and the first organic layer is disposed in the valley hole in contact with the lower inorganic layer.

In an embodiment, the valley hole may surround the pixel circuit unit in a plan view, and side surfaces of the inorganic layers defining the valley hole may define a boundary of the pixel circuit unit.

In an embodiment, the lower inorganic layer may have a lower valley hole defined thereon which corresponds to the portion of the valley hole, wherein the valley hole and the lower valley hole may expose the base layer.

In an embodiment, the first organic layer may be disposed in the lower valley hole is in contact with the exposed base layer.

In an embodiment, the inorganic layers may include first, second, third, fourth, fifth, and sixth inorganic layers sequentially stacked on the lower inorganic layer, and the semiconductor patterns comprise first and second semiconductor patterns each including a source, an active, and a drain, wherein the first pixel circuit may include a first transistor including the first semiconductor pattern disposed on the first inorganic layer, a first gate overlapping the active of the first semiconductor pattern and disposed on the second inorganic layer, and an upper electrode overlapping the first gate and disposed on the third inorganic layer, and a second transistor including the second semiconductor pattern disposed on the fourth inorganic layer, and a second gate overlapping the active of the second semiconductor pattern and disposed on the fifth inorganic layer, wherein the first semiconductor pattern may include polysilicon, and the second semiconductor pattern may include an oxide semiconductor.

In an embodiment, the first connection electrode may be disposed on the sixth inorganic layer, and the inorganic layers may have a sub-valley hole defined thereon which exposes the fourth inorganic layer by penetrating from the sixth inorganic layer to the fifth inorganic layer.

In an embodiment, the first organic layer may be disposed in the sub-valley hole and in contact with the exposed fourth inorganic layer.

In an embodiment, the first pixel circuit may further include a light blocking pattern overlapping the first semiconductor pattern, and disposed between the lower inorganic layer and the first inorganic layer.

In an embodiment, the valley hole may be obtained by removing a portion, of the inorganic layers, from an inorganic layer in contact with the first organic layer to an inorganic layer in contact with the lower inorganic layer.

In an embodiment, the first light emitting element and the second light emitting element may each include a first electrode, a second electrode disposed on the first electrode, and a light emitting layer disposed between the first electrode and the second electrode, and first color light generated in the first light emitting element may be different from second color light generated in the second light emitting element.

In an embodiment, the display device may further include a second organic layer disposed on the first organic layer having upper contact-holes which overlap respective first connection electrodes, and second connection electrodes disposed in the upper contact-holes connected to the respective first connection electrodes, wherein the respective first connection electrodes may be connected to the semiconductor pattern by respective second connection electrodes.

In an embodiment, at least some of the inorganic layers disposed on an outer side of the valley hole with respect to the pixel circuit unit may be in a floating state with respect to the at least some of the inorganic layers disposed on an inner side of the valley hole with respect to the pixel circuit unit.

In an embodiment, the conductive patterns may include a scan line, a data line, and a voltage line connected to each of the first light emitting element and the second light emitting element.

An embodiment of a display device includes a base layer, a lower inorganic layer disposed on the base layer, inorganic layers disposed on the lower inorganic layer and having contact-holes, a first pixel including a first pixel circuit and a first light emitting element, the first pixel circuit including first semiconductor patterns disposed between at least some of the inorganic layers, the first light emitting element is connected to the first pixel circuit through a first contact-hole among the contact holes and configured to emit first color light, and a second pixel including a second pixel circuit and a second light emitting element, the second pixel circuit including second semiconductor patterns disposed between at least some of the inorganic layers, the second light emitting element is connected to the second pixel circuit through a second contact-hole among the contact holes and configured to emit second color light different from the first color light, wherein the first pixel and the second pixel are included in a pixel circuit unit, a valley hole from an upper surface of the inorganic layers and through at least some of the inorganic layers does not overlap the contact-holes in a plan view, and the valley hole borders the pixel circuit unit.

In an embodiment, the display device may further include an organic layer disposed between the inorganic layers and the first and second light emitting elements, wherein the valley hole exposes the lower inorganic layer, the organic layer is disposed in the valley hole and the valley hole is in contact with the lower inorganic layer.

In an embodiment, at least some of the inorganic layers disposed on an outer side of the valley hole with respect to the pixel circuit unit may be in a floating state with respect to the at least some of the inorganic layers on an inner side of the valley hole with respect to the pixel circuit unit.

In an embodiment, the valley hole may surround the pixel circuit unit.

An embodiment of a display device includes a base layer, a lower inorganic layer disposed on the base layer, inorganic layers disposed on the lower inorganic layer, a first unit pixel including first pixels configured to emit light of different colors, each of the first pixels including a first pixel circuit and a first light emitting element, a second unit pixel including second pixels configured to emit light of different colors, each of the second pixels including a second pixel circuit and a second light emitting element, a first valley hole which is obtained by removing at least a portion of inorganic layers overlapping first pixel circuits, and which borders the first unit pixel, and a second valley hole which is obtained by removing at least a portion of inorganic layers overlapping second pixel circuits is removed, and which borders the second unit pixel, wherein a shape of the first valley hole and a shape of the second valley hole may be symmetrical in a plan view.

In an embodiment, the first valley hole and the second valley hole may expose the lower inorganic layer, and at least some of the inorganic layers disposed on an outer side of the first valley hole with respect to the first unit pixel may be in a floating state with respect to the at least some of the inorganic layers disposed on an inner side of the second valley hole with respect to the second unit pixel.

In an embodiment, the first valley hole may surround the first unit pixel, and the second valley hole may surround the second unit pixel.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
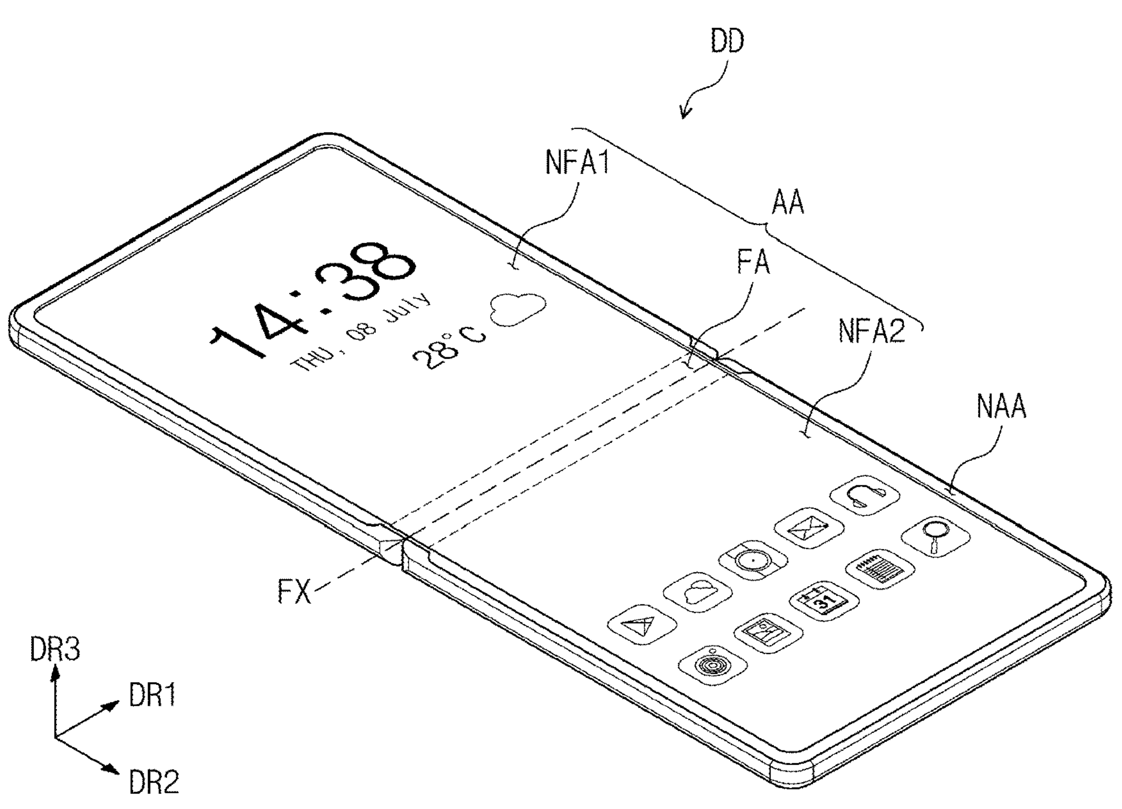
FIG. 1A is a perspective view of an unfolded state of a display device according to an embodiment of the inventive concept.

In the present disclosure, when an element (or a region, a layer, a portion, and the like) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents. The term "and/or," includes all combinations of one or more of which associated components may define.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the present invention. The terms of a singular form may include plural forms unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings.

It should be understood that the terms "comprise," "include," and "have" (as well as their variations such as "comprising" and "including") are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the present invention pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Hereinafter, embodiments of the inventive concept will be described with reference to the accompanying drawings.

Figure 1B:
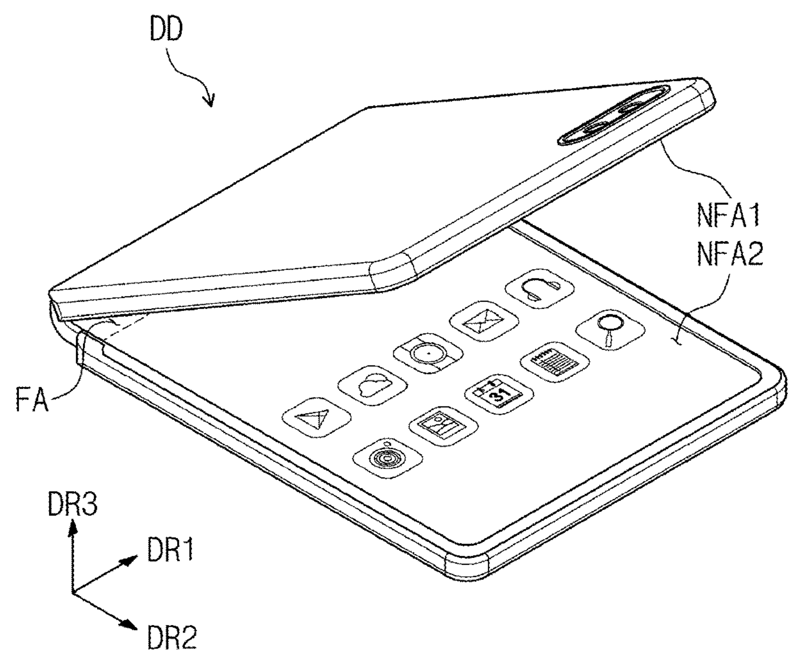
FIG. 1B is a perspective view of a folded state of a display device according to an embodiment of the inventive concept.

FIG. 1A is a perspective view of an unfolded state of a display device according to an embodiment of the inventive concept. FIG. 1B is a perspective view of a folded state of a display device according to an embodiment of the inventive concept.

Referring to FIG. 1A and FIG. 1B, a display device DD according to an embodiment of the inventive concept may be a device activated according to an electrical signal. For example, the display device DD may be a mobile phone, a tablet computer, a car navigation system unit, a game console, or a wearable device, but is not limited thereto. In FIG. 1A, the display device DD is exemplarily illustrated as a mobile phone.

The display device DD may display an image and sense an external input through an active region AA. When the display device DD is in an unfolded (spread-out) state, the active region AA may include a plane defined by a first direction DR1 and a second direction DR2. A thickness direction of the display device DD may be defined as a third direction DR3, which is perpendicular to each of the first direction DR1 and the second direction DR2. Therefore, a front surface (or an upper surface) and a rear surface (or a lower surface) of members constituting the display device DD may be defined on the basis of the third direction DR3.

A peripheral region NAA may surround at least a portion of the active region AA. The peripheral region NAA may be a region defined by a bezel pattern either printed on a window WM (see FIG. 2) to described later, or provided in a tape form. The bezel pattern may include a predetermined color.

FIG. 1A exemplarily illustrates a peripheral region NAA surrounding four side surfaces of the active region AA, but the embodiment of the inventive concept is not limited thereto, and the peripheral region NAA may not be disposed on at least one side surface of the active region AA, or the peripheral region NAA may be omitted.

The display device DD according to the inventive concept may include a folding region FA and non-folding regions NFA1 and NFA2 spaced apart along the second direction DR2 with the folding region FA interposed therebetween. The folding region FA may be folded based on a virtual folding axis FX extended along the first direction DR1.

When the display device DD is folded, a first non-folding region NFA1 and a second non-folding region NFA2 may face each other. Therefore, in a completely folded state, the active region AA may not be exposed to the outside, which may be referred to as in-folding. However, this is only exemplary, and the operation of the display device DD is not limited thereto.

For example, in an embodiment of the inventive concept, when the display device DD is folded, the first non-folding region NFA1 and the second non-folding region NFA2 may oppose each other in a state in which the active region AA is exposed to the outside. The above may be referred to as out-folding.

The display device DD may be capable of performing either the in-folding operation or the out-folding operation. Alternatively, the display device DD may perform both the in-folding operation and the out-folding operation. In this case, the same region of the display device DD, for example, the folding region FA may be in-folded and out-folded. Alternatively, some portions of the display device DD may be in-folded, and other regions thereof may be out-folded.

In FIG. 1A and FIG. 1B, one folding region FA and two non-folding regions NFA1 and NFA2 are exemplarily illustrated, but the number of folding regions and the number of non-folding regions are not limited thereto. For example, the display device DD may include a plurality of more than two non-folding regions, and a plurality of folding regions disposed between non-folding regions adjacent to each other.

In FIG. 1A and FIG. 1B, the folding axis FX is exemplarily illustrated as being parallel to a short axis of the display device DD extended in the first direction DR1, but the embodiment of the inventive concept is not limited thereto. For example, the folding axis FX may extend along a direction parallel to a long axis of the display device DD extended in the second direction DR2. In this case, the first non-folding region NFA1, the folding region FA, and the second non-folding region NFA2 may be sequentially arranged along the first direction DR1.

Figure 2:
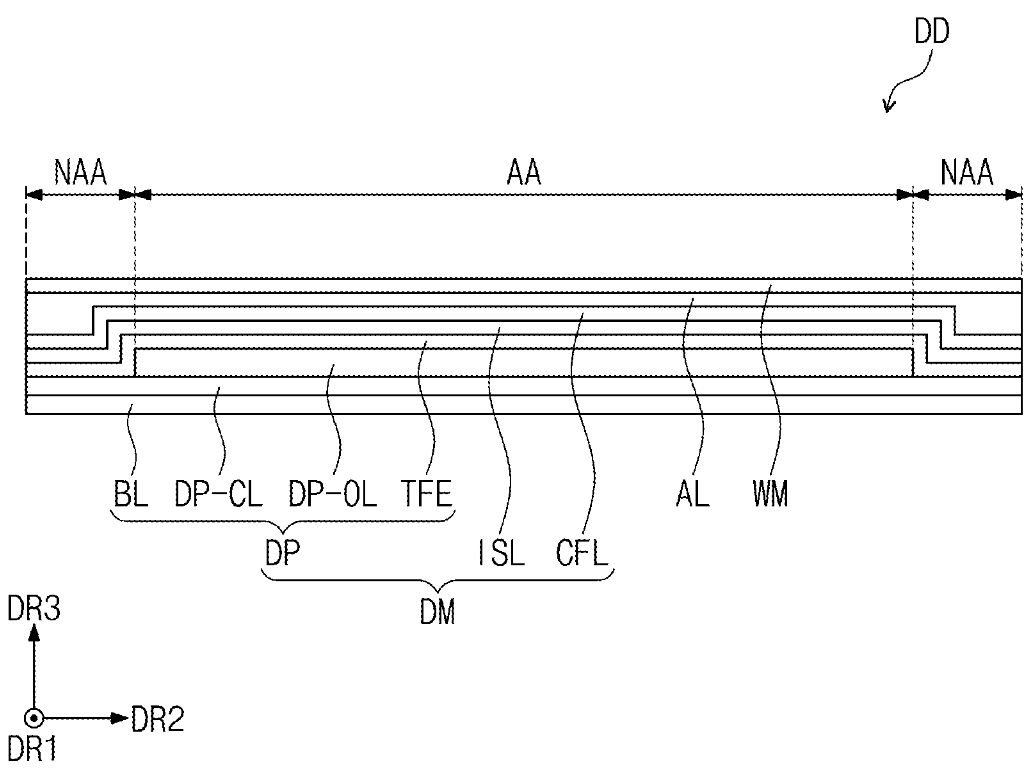
FIG. 2 is a cross-sectional view of a display device according to an embodiment of the inventive concept.

The appearance of the display device DD may be defined by the coupling of a case and the window WM (see FIG. 2). The case may be provided in plurality according to the number of non-folding regions, and may further include a hinge structure connecting the cases and overlapping a folding region to facilitate folding of the display device.

The display device DD may sense an external input applied from the outside. The external input may include various forms of inputs provided from the outside of the display device DD. For example, the external input may include not only a contact by a part of a user's body, such as a hand, but also an external input applied in close proximity, or adjacent to the display device DD at a predetermined distance (e.g., hovering). Also, the external input may have various forms, such as force, pressure, temperature, light, and the like.

Referring to FIG. 2, the display device DD may include the window WM, and a display module DM. The display module DM may include a display panel DP, an input sensing layer ISL, and a filter layer CFL. The window WM and the display module DM may be coupled to each other through an adhesive layer AL disposed between the window WM and the display module DM. The adhesive layer AL may include at least one of an optical clear adhesive, an optically clear adhesive resin, or a pressure sensitive adhesive (PSA).

A front surface of the window WM defines the active region AA of the display device DD. The window WM may include an optically transparent insulation material. For example, the window WM may include glass or plastic. The window WM may have a multi-layered structure or a single-layered structure. For example, the window WM may include a plurality of plastic films coupled using an adhesive, or a glass substrate and a plastic film coupled using an adhesive.

The display panel DP may be a component which substantially generates an image. The display panel DP may be a light emitting-type display panel, and for example, the display panel DP may be an organic light emitting display panel, an inorganic light emitting display panel, an organic-inorganic light emitting display panel, a quantum-dot display panel, a micro-LED display panel, or a nano-LED display panel.

The display panel DP may include a base layer BL, a circuit layer DP-CL, an element layer DP-OL, and an encapsulation layer TFE.

The base layer BL may be a base layer on which remaining components of the display panel DP are disposed. The base layer BL may be composed of a flexible material.

The circuit layer DP-CL is disposed on the base layer BL. The circuit layer DP-CL includes at least one insulation layer and a circuit element. The insulation layer includes at least one inorganic layer and at least one organic layer. The circuit element may include a pixel driving circuit and the like included in each of a plurality of pixels for displaying an image. The element layer DP-OL may include a light emitting element connected to the circuit layer DP-CL.

The encapsulation layer TFE encapsulates the element layer DP-OL. The encapsulation layer TFE may include at least one organic layer and inorganic layers for encapsulating the organic layer. The inorganic layer includes an inorganic material, and may protect the element layer DP-OL from moisture/oxygen.

The inorganic layer may include a silicon nitride layer, a silicon oxynitride layer, a silicon oxide layer, a titanium oxide layer, an aluminum oxide layer, or the like, but is not particularly limited thereto. The organic layer includes an organic material, and may protect the element layer DP-OL from foreign substances such as dust particles. The organic layer may include an acrylic organic material, but is not particularly limited thereto.

The input sensing layer ISL may be disposed on the display panel DP. The input sensing layer ISL may sense an external input applied through the window WM. The external input may be a user input. The user input may include various forms of external inputs, such as a part of a user's body, light, heat, a pen, a pressure, or the like.

The input sensing layer ISL may be formed on the display panel DP through a continuous process. In this case, the input sensing layer ISL may be described as being directly disposed on the display panel DP. Being 'directly disposed' may mean that a third element is not disposed between the input sensing layer ISL and the display panel DP. That is, a separate adhesive member may not be disposed between the input sensing layer ISL and the display panel DP. Alternatively, the input sensing layer ISL and the display panel DP may be coupled to each other through an adhesive member. The adhesive member may include a typical adhesive or pressure-sensitive adhesive.

The filter layer CFL may be disposed on the input sensing layer ISL. The filter layer CFL may include a reflection prevention layer which reduces the reflectance of external light incident from the outside of the display device DD. However, the embodiment of the inventive concept is not limited thereto, and the filter layer CFL may include a color filter capable of selectively transmitting light corresponding to light provided from the display panel DP.

Figure 3:
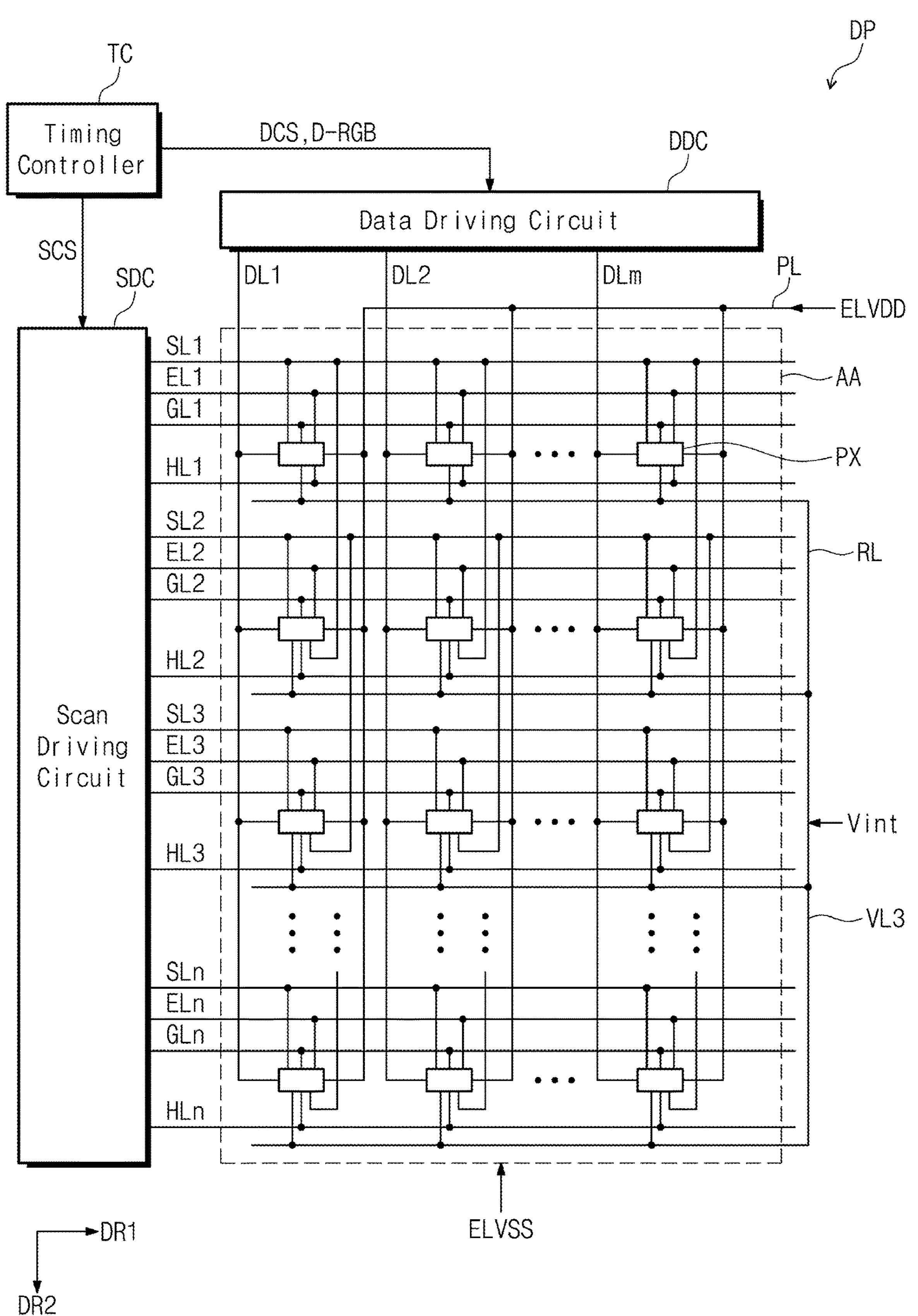
FIG. 3 is a block diagram of a display device according to an embodiment of the inventive concept.

FIG. 3 is a block diagram of a display device according to an embodiment of the inventive concept.

The display panel DP may include a timing controller TC, a scan driving circuit SDC, a data driving circuit DDC, and pixels PX overlapping the active region AA. In the present embodiment, the display panel DP will be described as an organic light emitting display panel among light emitting-type display panels.

The timing controller TC receives input image signals, and converts a data format of the input image signals to match interface specifications of the scan driving circuit SDC to generate image data D-RGB. The timing control unit TC outputs the image data D-RGB and various control signals DCS and SCS.

The scan driving circuit SDC receives a scan control signal SCS from the timing controller TC. The scan control signal SCS may include a vertical start signal for starting the operation of the scan driving circuit SDC, a clock signal for determining the output timing of signals, and the like. The scan driving circuit SDC generates a plurality of scan signals, and sequentially outputs the plurality of scan signals to corresponding signal lines (SL1 to SLn, and GL1 to Gln). Also, the scan driver SDC generates a plurality of light emission control signals in response to the scan control signal SCS, and outputs the plurality of light emission control signals to corresponding signal lines EL1 to ELn.

In FIG. 3, a plurality of scan signals and a plurality of light emission control signals are illustrated as being output from one scan driving circuit SDC, but the embodiment of the inventive concept is not limited thereto. In an embodiment of the inventive concept, a plurality of scan driving circuits may divide, generate, and then output scan signals, and may divide, generate, and then output a plurality of light emission control signals. In addition, in an embodiment of the inventive concept, a driving circuit for generating and outputting a plurality of scan signals and a driving circuit for generating and outputting a plurality of light emission control signals may be different from each other.

The data driving circuit DDC receives a data control signal DCS and the image data D-RGB from the timing control unit TC. The data driving circuit DDC converts the image data D-RGB into data signals, and then outputs the data signals to a plurality of data lines DL1 to DLm to be described later. The data signals are analog voltages corresponding to a gray scale value of the image data D-RGB.

The display panel DP includes scan lines SL1 to SLn of a first group, scan lines GL1 to GLn of a second group, scan lines HL1 to HLn of a third group, light emission lines EL1 to ELn, data lines DL1 to DLm, a first voltage line PL, a second voltage line RL, and a plurality of pixels PX. The scan lines of the first group SL1 to SLn, the scan lines of the second group GL1 to GLn, the scan lines of the third group HL1 to HLn, and the light emission lines EL1 to ELn are extended in the first direction DR1, and arranged in the second direction DR2 crossing the first direction DR1.

The plurality of data lines DL1 to the DLm cross the scan lines of the first group SL1 to SLn, the scan lines of the second group GL1 to GLn, the scan lines of the third group HL1 to HLn, and the light emission lines EL1 to ELn while being insulated therefrom. Each of the plurality of pixels PX is connected to corresponding signal lines among the signal lines. Depending on the configuration of a driving circuit of the pixels PX, the connection relationship between the pixels PX and the signal lines may be changed.

The first voltage line PL1 receives a first power voltage ELVDD. The second voltage line RL receives an initialization voltage Vint. The initialization voltage Vint has a lower level than the first power voltage ELVDD. A second power voltage ELVSS is applied to a light emitting element OLED (see FIG. 4). The second power voltage ELVSS has a lower level than the first power voltage ELVDD.

According to the inventive concept, "conductive patterns" described in the claims may correspond to at least one of scan lines, data lines, or power lines.

The plurality of pixels PX may include a plurality of groups which generate light of different colors from each other. For example, the pixels may include red pixels which generate red color light, green pixels which generate green color light, and blue pixels which generate blue color light. A light emitting element of a red pixel, a light emitting element of a green pixel, and a light emitting element of a blue pixel may include light emitting layers of different materials.

A pixel circuit PDC (see FIG. 4) included in each of the pixels PX may include a plurality of transistors, a capacitor electrically connected to the transistors, and the above-described conductive patterns. At least one of the scan driving circuit SDC and the data driving circuit DDC may include a plurality of transistors formed by the same process as a process of forming the pixel circuit PDC (see FIG. 4).

Through performing a photolithography process a plurality of times, the scan lines, the plurality of pixels PX, the scan driving circuit SDC, and the data driving circuit DDC may be formed on the base layer BL (see FIG. 2). Through performing a deposition process or a coating process a plurality of times, a plurality of insulation layers may be formed on the base layer BL (see FIG. 2). The plurality of insulation layers may be a thin film disposed to correspond to the plurality of pixels PX, and some of the plurality of insulation layers may include an insulation pattern overlapping a particular conductive pattern. The insulation layers include an organic layer and/or an inorganic layer.

Figure 4:
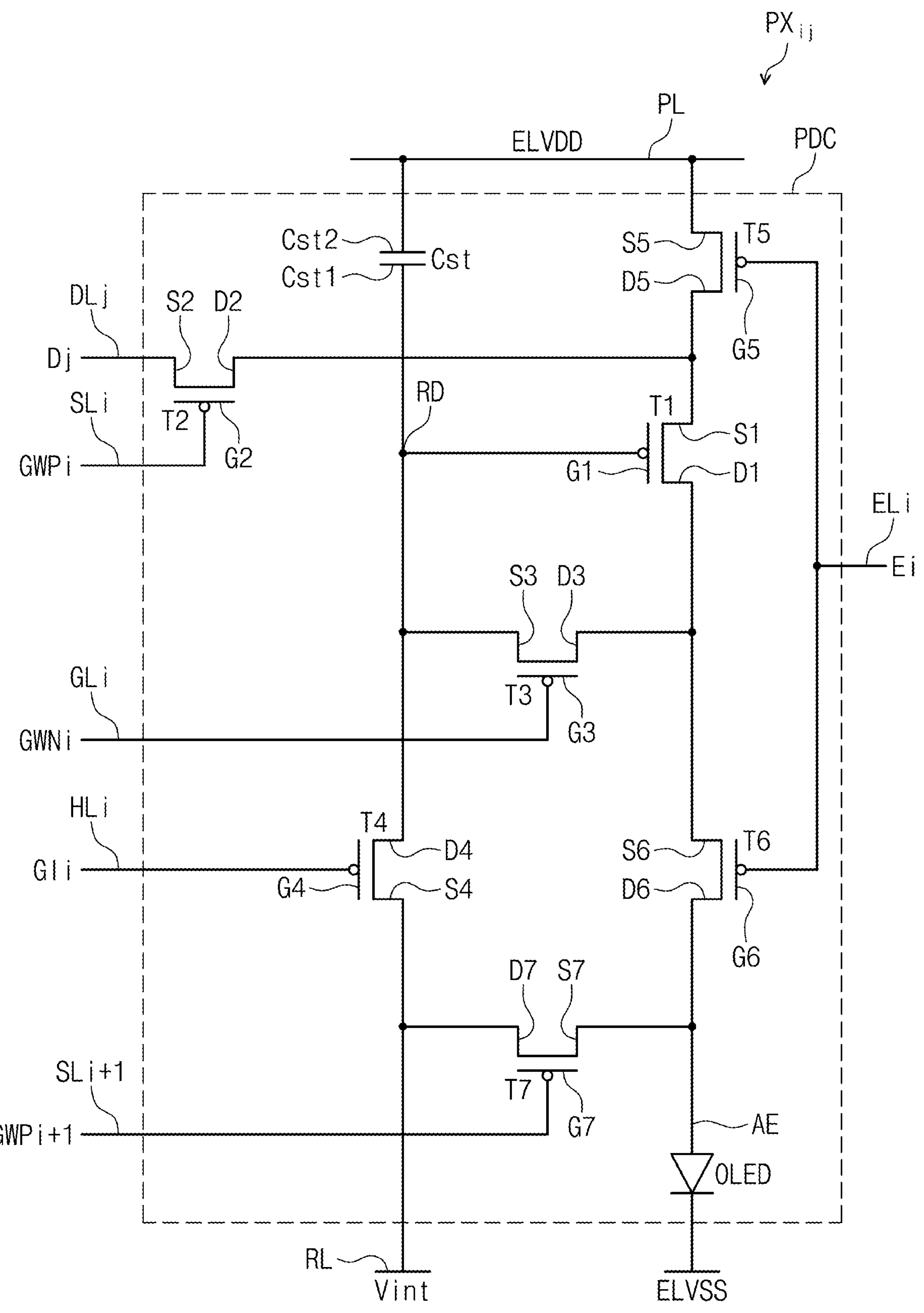
FIG. 4 is an equivalent circuit diagram of a pixel according to an embodiment of the inventive concept.

FIG. 4 is an equivalent circuit diagram of a pixel according to an embodiment of the inventive concept.

FIG. 4 exemplarily illustrates a pixel PXij connected to an i-th scan line SLi among the scan lines SL1 to SLn of the first group, and connected to a j-th data line DLj among the plurality of data lines DL1 to DLm.

In the present embodiment, the pixel circuit PDC may include first to seventh transistors T1 to T7, a capacitor Cst, and the above-described conductive patterns. In the present embodiment, the first transistor T1, the second transistor T2, and the fifth transistor T5 to the seventh transistor T7 are described as P-type transistors, and the third transistor T3 and the fourth transistor T4 are described as N-type transistors. However, the embodiment of the inventive concept is not limited thereto, and the first to seventh transistors T1 to T7 may be implemented as either P-type transistors or N-type transistors. Also, in an embodiment of the inventive concept, at least one of the first to seventh transistors T1 to T7 may be omitted.

In the present embodiment, the first transistor T1 may be a driving transistor, and the second transistor T2 may be a switching transistor. The capacitor Cst is connected between the first voltage line PL receiving the first power voltage ELVDD and a reference node RD. The capacitor Cst includes a first electrode Cst1 connected to the reference node RD and a second electrode Cst2 connected to the first voltage line PL.

The first transistor T1 is connected between the first voltage line PL and one electrode of the light emitting element OLED. A source S1 of the first transistor T1 is electrically connected to the first voltage line PL. Between the source S1 of the first transistor T1 and the first voltage line PL, another transistor may be disposed or omitted.

A drain D1 of the first transistor T1 is electrically connected to a first electrode AE of the light emitting element OLED. Between the drain D1 of the first transistor T1 and the first electrode AE of the light emitting element OLED, another transistor may be disposed or omitted. A gate G1 of the first transistor T1 is electrically connected to the reference node RD.

The second transistor T2 is connected between the j-th data line DLj and the source S1 of the first transistor T1. A source S2 of the second transistor T2 is electrically connected to the j-th data line DLj, and a drain D2 of the second transistor T2 is electrically connected to the source S1 of the first transistor T1. In the present embodiment, a gate G2 of the second transistor T2 may be electrically connected to the i-th scan line SLi of the first group.

The third transistor T3 is connected between the reference node RD and the drain D1 of the first transistor T1. A drain D3 of the third transistor T3 is electrically connected to the drain D1 of the first transistor T1, and a source S3 of the third transistor T3 is electrically connected to the reference node RD. In the present embodiment, a gate G3 of the third transistor T3 may be electrically connected to an i-th scan GLi of the second group.

The fourth transistor T4 is connected between the reference node RD and the second voltage line RL. A drain D4 of the fourth transistor T4 is electrically connected to the reference node RD, and a source S4 of the fourth transistor T4 is electrically connected to the second voltage line RL. In the present embodiment, a gate G4 of the fourth transistor T4 may be electrically connected to an i-th scan line HLi of the third group.

The fifth transistor T5 is connected between the first voltage line PL and the source S1 of the first transistor T1. A source S5 of the fifth transistor T5 is electrically connected to the first voltage line PL, and a drain D5 of the fifth transistor T5 is electrically connected to the source S1 of the first transistor T1. A gate G5 of the fifth transistor T5 may be electrically connected to an i-th light emission line EL1.

The sixth transistor T6 is connected between the drain D1 of the first transistor T1 and the light emitting element OLED. A source S6 of the sixth transistor T6 is electrically connected to the drain D1 of the first transistor T1, and a drain D6 of the sixth transistor T6 is electrically connected to the first electrode AE of the light emitting element OLED. A gate G6 of the sixth transistor T6 may be electrically connected to the i-th light emission line EL1.

The seventh transistor T7 is connected between the drain D6 of the sixth transistor T6 and the second voltage line RL. A source S7 of the seventh transistor T7 is electrically connected to the drain D6 of the sixth transistor T6, and a drain D7 of the seventh transistor T7 is electrically connected to the second voltage line RL. A gate G7 of the seventh transistor T7 may be electrically connected to an i+1-th scan line SLi+1 of the first group.

In operation, ith scan signals GWPi, GWNi, Gli, and GWPi+1 may be applied to the ith scan signal lines SLi, GLi, HLi, and SLi+1, respectively. Further, in operation, a data signal Dj may be applied to the ith data line DLj; and emission signal Ei may be applied to the ith emission line Ei.

Figure 5:
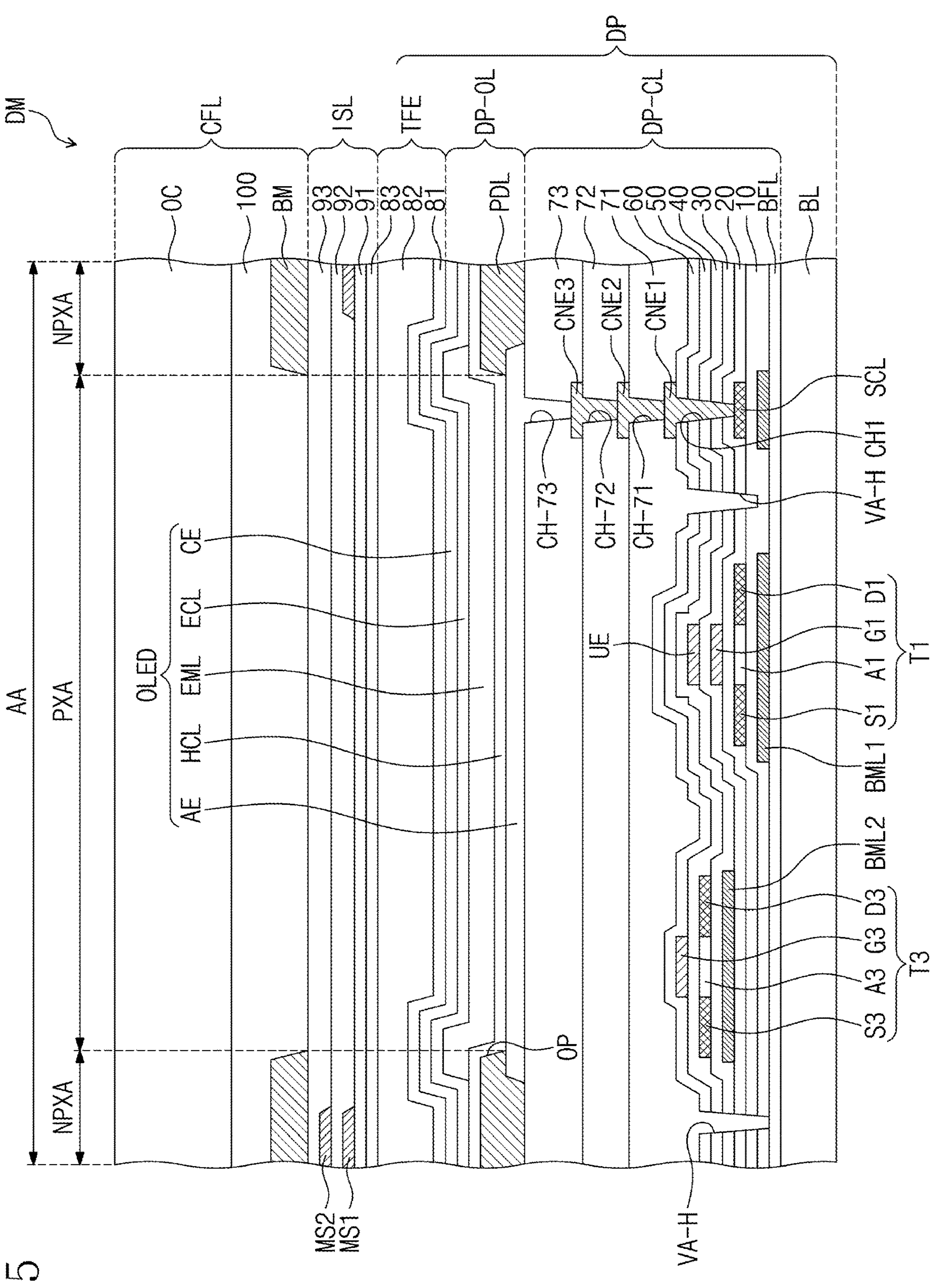
FIG. 5 is a cross-sectional view of a display module according to an embodiment of the inventive concept.

FIG. 5 is a cross-sectional view of a display module according to an embodiment of the inventive concept.

FIG. 5 illustrates a cross-section of a portion corresponding to the first transistor T1 and the third transistor T3 among the first to seventh transistors T1 to T7 described with reference to FIG. 4.

The display module DM may include the display panel DP, the input sensing layer ISL, and the filter layer CFL. The display panel DP may include the base layer BL, the circuit layer DP-CL, the element layer DP-OL, and the encapsulation layer TFE.

The display panel DP may further include functional layers, such as a reflection prevention layer, a refractive index control layer, and the like. The circuit layer DP-CL includes at least a plurality of insulation layers and the pixel circuit PDC (see FIG. 4). Hereinafter, the insulation layers may include an organic layer and/or an inorganic layer.

The base layer BL may include a synthetic resin film. A synthetic resin layer may include a thermosetting resin. Particularly, the synthetic resin layer may be a polyimide-based resin layer, and the material thereof is not particularly limited. The synthetic resin layer may include at least any one of an acrylic resin, a methacrylic resin, polyisoprene, a vinyl-based resin, an epoxy-based resin, a urethane-based resin, a cellulose-based resin, a siloxane-based resin, a polyamide-based resin, or a perylene-based resin. In addition, the base layer may include a glass substrate, a metal substrate, an organic/inorganic composite substrate, or the like.

The base layer BL may be provided in a form in which organic layers and inorganic layers are alternately stacked. For example, the base layer BL may be provided having a structure in which a first organic layer including polyimide, a first inorganic layer disposed on the first organic layer, a second organic layer including polyimide and disposed on the first inorganic layer, and a second inorganic layer disposed on the second organic layer are alternately stacked, but is not limited to any one embodiment.

The circuit layer DP-CL may include a plurality of insulation layers BFL to 73 and conductive patterns included in transistors.

An insulation layer, a semiconductor layer, and a conductive layer may be formed on the circuit layer DP-CL by coating, deposition, or the like. Thereafter, the insulation layer, the semiconductor layer, and the conductive layer may be selectively patterned by photolithography. In this manner, a semiconductor pattern, a conductive pattern, a signal line, and the like are formed.

The circuit layer DP-CL may include the plurality of insulation layers BFL to 73, electrodes included in the capacitor Cst (see FIG. 4), electrodes included in the transistors T1 to T7 (see FIG. 4), and the above-described conductive patterns. In the present specification, a buffer layer BFL in contact with the base layer BL may be defined as a “lower inorganic layer.”

The lower inorganic layer BFL may be in contact with the base layer BL. The lower inorganic layer BFL may include an inorganic material. For example, the lower inorganic layer BFL may include at least one of aluminum oxide, titanium oxide, silicon oxide, silicon nitride, silicon oxynitride, zirconium oxide, or hafnium oxide. The lower inorganic layer BFL may be formed of multiple layers. The lower inorganic layer BFL may reduce surface energy of the base layer BL such that the pixel PX is stably formed on the base layer BL.

A first light blocking pattern BML1 may be disposed on the lower inorganic layer BFL. The first light blocking pattern BML1 may overlap a semiconductor pattern of the first transistor T1. When the lower inorganic layer BFL is omitted, the first light blocking pattern BML1 may be directly disposed on the base layer BL. The first light blocking pattern BML1 may include molybdenum.

The first light blocking pattern BML1 may perform a light blocking function. The first light blocking pattern BML1 may prevent an electric potential due to a polarization phenomenon between insulation layers disposed on the first light blocking pattern BML1 from affecting the first to seventh transistors T1 to T7.

A first inorganic layer 10 covers the first light blocking pattern BML1 and is disposed on the lower inorganic layer BFL. The first inorganic layer 10 may include an inorganic material. For example, the first inorganic layer 10 may include at least one of aluminum oxide, titanium oxide, silicon oxide, silicon nitride, silicon oxynitride, zirconium oxide, or hafnium oxide. The first inorganic layer 10 may be formed of a plurality of layers.

The semiconductor pattern of the first transistor T1 is disposed on the first inorganic layer 10. The semiconductor pattern may include a silicon semiconductor. The semiconductor pattern may include polysilicon. However, the embodiment of the inventive concept is not limited thereto, and the semiconductor pattern may include amorphous silicon.

The source S1, an active A1, and the drain D1 of the first transistor T1 are formed from a semiconductor pattern. The source S1 and the drain D1 of the first transistor T1 are formed spaced apart from each other with the active A1 interposed therebetween.

FIG. 5 illustrates only a portion of the semiconductor pattern, and the semiconductor pattern may be further disposed in another region of the pixel PXij (see FIG. 4). The semiconductor pattern has different electrical properties depending on whether the semiconductor pattern is doped or not. The semiconductor pattern may include a doped region and a non-doped region. The doped region may be doped with an N-type dopant or a P-type dopant. A P-type transistor includes a doped region doped with the P-type dopant.

A connection signal line SCL is disposed on the first inorganic layer 10. The connection signal line SCL may be connected to the sixth transistor T6 (see FIG. 3) on a plane.

A second inorganic layer 20 covers the semiconductor pattern and the connection signal line SCL and is disposed on the first inorganic layer 10. The second inorganic layer 20 may include at least one of aluminum oxide, titanium oxide, silicon oxide, silicon nitride, silicon oxynitride, zirconium oxide, or hafnium oxide.

The gate G1 of the first transistor T1 is disposed on the second inorganic layer 20. The gate G1 may be a portion of a metal pattern. The gate G1 of the first transistor T1 overlaps the active A1 of the first transistor T1. In a process of doping the semiconductor pattern, the gate G1 of the first transistor T1 is like a mask.

A third inorganic layer 30 covers the gate G1 and is disposed on the second inorganic layer 20. The third inorganic layer 30 may include at least one of aluminum oxide, titanium oxide, silicon oxide, silicon nitride, silicon oxynitride, zirconium oxide, or hafnium oxide.

An upper electrode UE may be disposed on the third inorganic layer 30. The upper electrode UE may overlap the gate G1. The upper electrode UE may be a portion of a metal pattern or a portion of a doped semiconductor pattern. A portion of the gate G1 and the upper electrode UE overlapping the same may define the capacitor Cst (see FIG. 4). In an embodiment, the upper electrode UE may be omitted.

A second semiconductor pattern BML2 may be disposed on the third inorganic layer 30. The second light blocking pattern BML2 may overlap a semiconductor pattern of the third transistor T3. The second light blocking pattern BML2 may include molybdenum. According to an embodiment, the second light blocking pattern BML2 may be omitted.

FIG. 5 illustrates that the third inorganic layer 30 is disposed in the entire region of the active region AA, but the embodiment of the inventive concept is not limited thereto, and the third inorganic layer 30 may be replaced with an insulation pattern. At this time, the upper electrode UE is disposed on the insulation pattern. The upper electrode UE may serve as a mask which forms an insulation pattern from the third insulation layer 30.

According to an embodiment, the first electrode Cst1 and the second electrode Cst2 of the capacitor Cst (see FIG. 4) may be formed by the same process as a process of forming the gate G1 and the upper electrode UE. The first electrode Cst1 may be disposed on the second insulation layer 20. The first electrode Cst1 may be electrically connected to the gate G1. The first electrode Cst1 may have a shape of a single body with the gate G1.

According to an embodiment, the first electrode Cst1 of the storage capacitor Cst may be the gate G1 and the upper electrode UE may be the second electrode Cst2.

A fourth inorganic layer 40 covers the upper electrode UE and the second light blocking pattern BML2 and is disposed on the third inorganic layer 30. The fourth inorganic layer 40 may include at least one of aluminum oxide, titanium oxide, silicon oxide, silicon nitride, silicon oxynitride, zirconium oxide, or hafnium oxide.

Sources S2, S5, S6, and S7 and drains D2, D5, D6, and D7 of the second, fifth, sixth, and seventh transistors T2, T5, T6, and T7 described with reference to FIG. 4 may be formed by the same process as the process of forming the source S1 and the drain D1 of the first transistor T1, and gates G2, G5, G6, and G7 of the second, fifth, sixth, and seventh transistors T2, T5, T6, and T7 may be formed by the same process as the process of forming the gate G1 of the first transistor T1. Patterns formed by the same process may be disposed on the same layer.

The semiconductor pattern of the third transistor T3 is disposed on the fourth inorganic layer 40. The semiconductor pattern may include a metal oxide. An oxide semiconductor may include a crystalline or amorphous oxide semiconductor.

For example, the oxide semiconductor may include any one among an indium-tin oxide (ITO), an indium-gallium-zinc oxide (IGZO), a zinc oxide (ZnO), an indium-zinc oxide (IZnO), a zinc-indium oxide (ZIO), an indium oxide (InO), a titanium oxide (TiO), an indium-zinc-tin oxide (IZTO), and a zinc-tin oxide (ZTO).

The source S3, an active A3, and the drain D3 of the third transistor T3 are formed from a semiconductor pattern. The source S3 and the drain D3 include a metal reduced from a metal oxide semiconductor. The source S3 and the drain D3 have a predetermined thickness from an upper surface of the semiconductor pattern, and may include a metal layer including the reduced metal.

A fifth inorganic layer 50 covers the semiconductor pattern of the third transistor T3 and is disposed on the second inorganic layer 40. In the present embodiment, the fifth inorganic layer 50 may including a silicon oxide layer and a silicon nitride layer. The fifth inorganic layer 50 may include a plurality of alternately stacked silicon oxide layers and silicon nitride layers.

The gate G3 of the third transistor T3 is disposed on the fifth inorganic layer 50. The gate G3 may be a portion of a metal pattern. The gate G3 of the third transistor T3 overlaps the active A3 of the third transistor T3.

FIG. 5 illustrates that the fifth inorganic layer 50 is disposed in the entire region of the active region AA, but the embodiment of the inventive concept is not limited thereto, and the fifth inorganic layer 50 may be replaced with an insulation pattern. The gate G3 of the third transistor T3 is disposed on the insulation pattern. In the present embodiment, the gate G3 may have the same shape as that of the insulation pattern on a plane.

A sixth inorganic layer 60 covers the gate G3 and is disposed on the fifth inorganic layer 50. In the present embodiment, the sixth inorganic layer 60 may including a silicon oxide layer and a silicon nitride layer. The sixth inorganic layer 60 may include a plurality of alternately stacked silicon oxide layers and silicon nitride layers.

According to an embodiment, the source S4 and the drain D4 of the fourth transistor T4 (see FIG. 3A) may be formed by the same process as the process of forming the source S3 and the drain D3 of the third transistor T3, and the gate G3 of the fourth transistor T4 (see FIG. 3) may be formed by the same process as the process of forming the gate G3 of the third transistor T3.

At least one insulation layer may be further disposed on the sixth insulation layer 60. As in the present embodiment, a first organic layer 71 to a third organic layer 73 may be disposed on the sixth inorganic layer 60. The first organic layer 71 to the third organic layer 73 may include an organic material. For example, the first organic layer 71 to the third organic layer 73 may include a polyimide-based resin. However, the embodiment of the inventive concept is not limited thereto, and the first organic layer 71 to the third organic layer 73 may include at least one of an acrylic resin, a methacrylic resin, polyisoprene, a vinyl-based resin, an epoxy-based resin, a urethane-based resin, a cellulose-based resin, a siloxane-based resin, a polyamide-based resin, or a perylene-based resin.

A first connection electrode CNE1 may be disposed on the sixth insulation layer 60. The first connection electrode CNE1 may be connected to the connection signal line SCL through a first contact-hole CH1 penetrating the first to sixth insulation layers 10 to 60. The first connection electrode CNE1 according to an embodiment may be connected to conductive patterns disposed on the same layer as the layer on which the semiconductor pattern of the first transistor T1 is disposed, and is not limited to any one embodiment.

The first organic layer 71 may cover at least a portion of the first connection electrode CNE1 and is disposed on the sixth inorganic layer 60.

A second connection electrode CNE2 may be disposed on the first organic layer 71. The second connection electrode CNE2 is connected to the first connection electrode CNE1 through a second contact-hole CH-71 penetrating the first organic layer 71.

The second organic layer 72 may cover a portion of the second connection electrode CNE2 and is disposed on the first organic layer 71.

A third connection electrode CNE3 may be disposed on the second organic layer 72. The third connection electrode CNE3 is connected to the second connection electrode CNE2 through a third contact-hole CH-73 penetrating the second organic layer 72.

The third organic layer 73 may cover at least a portion of the third connection electrode CNE3 and is disposed on the second organic layer 72. In the display module DM according to an embodiment, the third connection electrode CNE3 and the third organic layer 73 may be omitted. At this time, the first electrode AE of the light emitting element OLED may be connected to the second connection electrode CNE2 through the third contact-hole CH-73 of the second organic layer 72, but is not limited to any one embodiment.

Components included in the light emitting element OLED may be disposed on the third organic layer 73. The light emitting device OLED may include the first electrode AE, a hole control layer HCL, a light emitting layer EML, an electron control layer ECL, and a second electrode CE. The pixel definition film PDL is disposed on the third organic layer 73. The pixel definition film PDL may have an opening OP defined thereon which exposes at least a portion of the first electrode AE. In the present embodiment, the pixel definition film PDL has a predetermined color, and may include a light absorbing material. For example, the pixel definition film PDL may have a black color.

The first to seventh transistors T1 to T7 (see FIG. 3) may constitute one pixel circuit PDC (see FIG. 4), and the pixel circuit PDC (see FIG. 4) and the light emitting element OLED may be connected to constitute one pixel PXij (see FIG. 4).

The opening OP of the pixel definition film PDL may define a light emitting region PXA. For example, a plurality of pixels PXij (see FIG. 3) may be disposed by a predetermined rule on a plane of the display panel DP. A region in which the plurality of pixels PXij are disposed may be defined as the active region AA (see FIG. 1A), and the active region AA may include a plurality of light emitting regions and a non-light emitting region NPXA adjacent to the light emitting regions. The non-light emitting region NPXA may surround the light emitting region PXA.

The first electrode AE is disposed on the third organic layer 73. The first electrode AE is connected to the third connection electrode CNE3 through a fourth contact-hole CH-73 penetrating the third organic layer 73.

The hole control layer HCL disposed on the first electrode AE. The hole control layer HCL may be commonly disposed in the light emitting region PXA and the non-light emitting region NPXA. A common layer such as the hole control layer HCL and the electron control layer ECL may be commonly formed in the plurality of pixels PXij. The hole control layer HCL may include a hole transport layer and a hole injection layer.

The light emitting layer EML is disposed on the hole control layer HCL. The light emitting layer EML may overlap the opening OP. The light emitting layer EML may be divided and formed in each of the plurality of pixels PXij.

Although a patterned light emitting layer EML is exemplarily illustrated in the present embodiment, the light emitting layer EML may be commonly disposed in the plurality of pixels PXij. At this time, the light emitting layer EML may generate white light or blue light. In addition, the light emitting layer EML may have a multi-layered structure.

The electron control layer ECL is disposed on the light emitting layer EML. The electron control layer ECL may include an electron transport layer and an electron injection layer. The second electrode CE is disposed on the electron control layer ECL. The electron control layer ECL and the second electrode CE are commonly disposed in the plurality of pixels PXij.

The encapsulation layer TFE is disposed on the second electrode CE. The encapsulation layer TFE is commonly disposed in the plurality of pixels PXij. In the present embodiment, the encapsulation layer TFE directly covers the second electrode CE. The encapsulation layer TFE may include a first thin film inorganic layer 81, a thin film organic layer 82, and a second thin film inorganic layer 83. However, the embodiment of the inventive concept is not limited thereto, and the encapsulation layer TFE may further include a plurality of inorganic layers and a plurality of organic layers.

The first thin film inorganic layer 81 may be in contact with the second electrode CE. The first thin film inorganic layer 81 may prevent external moisture or oxygen from penetrating into the light emitting layer EML. For example, the first thin film inorganic layer 81 may include a silicon nitride, a silicon oxide, or a compound thereof. The first thin film inorganic layer 81 may be formed through a deposition process.

The thin film organic layer 82 may be disposed on the first thin film inorganic layer 81 to be in contact with the first thin film inorganic layer 81. The thin film organic layer 82 may provide a flat surface on the first thin film inorganic layer 81. Curves formed on an upper surface of the first thin film inorganic layer 81 or particles and the like present on the first thin film inorganic layer 81 are covered by the thin film organic layer 82, so that the surface state of the upper surface of the first thin film inorganic layer 81 may be prevented from affecting components formed on the thin film organic layer 82. The thin film organic layer 82 may include an organic material, and may be formed though a solution process, such as spin coating, slit coating, and ink jet processes.

The second thin film inorganic layer 83 is disposed on the thin film organic layer 82 and covers the thin film organic layer 82. The second thin film inorganic layer 83 may be stably formed on a relatively flat surface than being disposed on the first thin film inorganic layer 81. The second thin film inorganic layer 83 prevents moisture, oxygen, or the like from entering the light emitting layer EML. The second thin film inorganic layer 83 may include a silicon nitride, a silicon oxide, or a compound thereof. The second thin film inorganic layer 83 may be formed through a deposition process.

The input sensing layer ISL may be directly disposed on the encapsulation layer TFE. The input sensing layer ISL may include a plurality of conductive patterns MS1 and MS2, and sensing insulation layers. The sensing insulation layers may include a first sensing insulation layer 91, a second sensing insulation layer 92, and a third sensing insulation layer 93.

The first sensing insulation layer 91 is disposed on the encapsulation layer TFE. First conductive patterns MS1 are disposed on the first sensing insulation layer 91, and may be covered by the second sensing insulation layer 92. Second conductive patterns MS2 are disposed on the second sensing insulation layer 92, and may be covered by the third sensing insulation layer 93.

Each of the conductive patterns MS1 and MS2 has conductivity. Each of the conductive patterns MS1 and MS2 may be provided as a single layer, or a plurality of layers, but is not limited to any one embodiment. At least one conductive pattern among the conductive patterns MS1 and MS2 according to the inventive concept may be provided as a mesh line on a plane.

Mesh lines constituting the conductive patterns MS1 and MS2 may overlap the pixel definition film PDL on a plane. Therefore, even when the input sensing layer ISL is directly formed on the display panel DP, light formed in the pixels PXij (see FIG. 4) of the display panel DP may be provided to a user without interference of the input sensing layer ISL.

The filter layer CFL may include a color filter 100, a black matrix BM, and an overcoat layer OC.

The color filter 100 may include a polymer photosensitive resin and a pigment or dye. For example, a color filter 100 overlapping a light emitting layer EML which provides a blue color light may include a blue pigment or dye, a color filter 100 overlapping a light emitting layer EML which provides a green color light may include a green pigment or dye, and a color filter 100 overlapping a light emitting layer EML which provides a red color light may include a red pigment or dye.

However, the embodiment of the inventive concept is not limited thereto, and the color filter 100 overlapping the light emitting layer EML which provides a blue light may not include a pigment or dye. At this time, the color filter 100 may be transparent, and the color filter 100 may be formed of a transparent photosensitive resin.

The black matrix BM may be disposed between color filters providing different light from each other. The black matrix BM is a pattern having a black color, and may be a grid-type matrix. The black matrix BM may include a black coloring agent. The black coloring agent may include a black dye or a black pigment. The black coloring agent may include carbon black, or a metal such as chromium or an oxide thereof.

The overcoat layer OC may be disposed on the color filter 100 and the black matrix BM. The overcoat layer OC may be a layer which surrounds irregularities generated during a process of forming the color filter 100 and the black matrix BM, and provides a flat surface. That is, the overcoat layer OC may be a planarization layer. The window WM described with reference to FIG. 2 may be coupled to the overcoat layer OC by the adhesive layer AL.

The circuit layer DP-CL according to the present embodiment may have a valley hole VA-H defined thereon in which at least a portion of the first to sixth inorganic layers 10 to 60 ("inorganic layers" in the claims) is removed. The valley hole VA-H may be formed by penetrating from the sixth inorganic layer 60 disposed in a lower portion of the first organic layer 71 to the first inorganic layer 10 disposed on the lower inorganic layer BFL.

The valley hole VA-H according to the inventive concept may not overlap the contact-holes CH-71, CH-72, and CH-73 in which the first to third connection electrodes CNE1, CNE2, and CNE3 are disposed. The valley hole VA-H may be formed by the same process as a process of depositing the sixth inorganic layer 60 and then forming the first contact-hole CH1. Therefore, the valley hole VA-H may be formed with the same mask as a mask used for forming the first contact-hole CH1.

According to an embodiment, a portion (right portion) of the valley hole VA-H may expose the lower inorganic layer BFL. The first organic layer 71 is disposed in the portion of the valley hole VA-H and may come into contact with the exposed lower inorganic layer BFL.

According to an embodiment, the other portion of the valley hole VA-H may be formed by removing a portion of the first inorganic layer 10 from the sixth inorganic layer 60. The first organic layer 71 is disposed in the other portion of the valley hole VA-H and may come into contact with an exposed inner surface of the first inorganic layer 10.

The valley hole VA-H according to an embodiment may float the first to sixth inorganic layers 10 to 60 which overlap the pixel circuit PDC. A description thereof will be given later.

Figure 6:
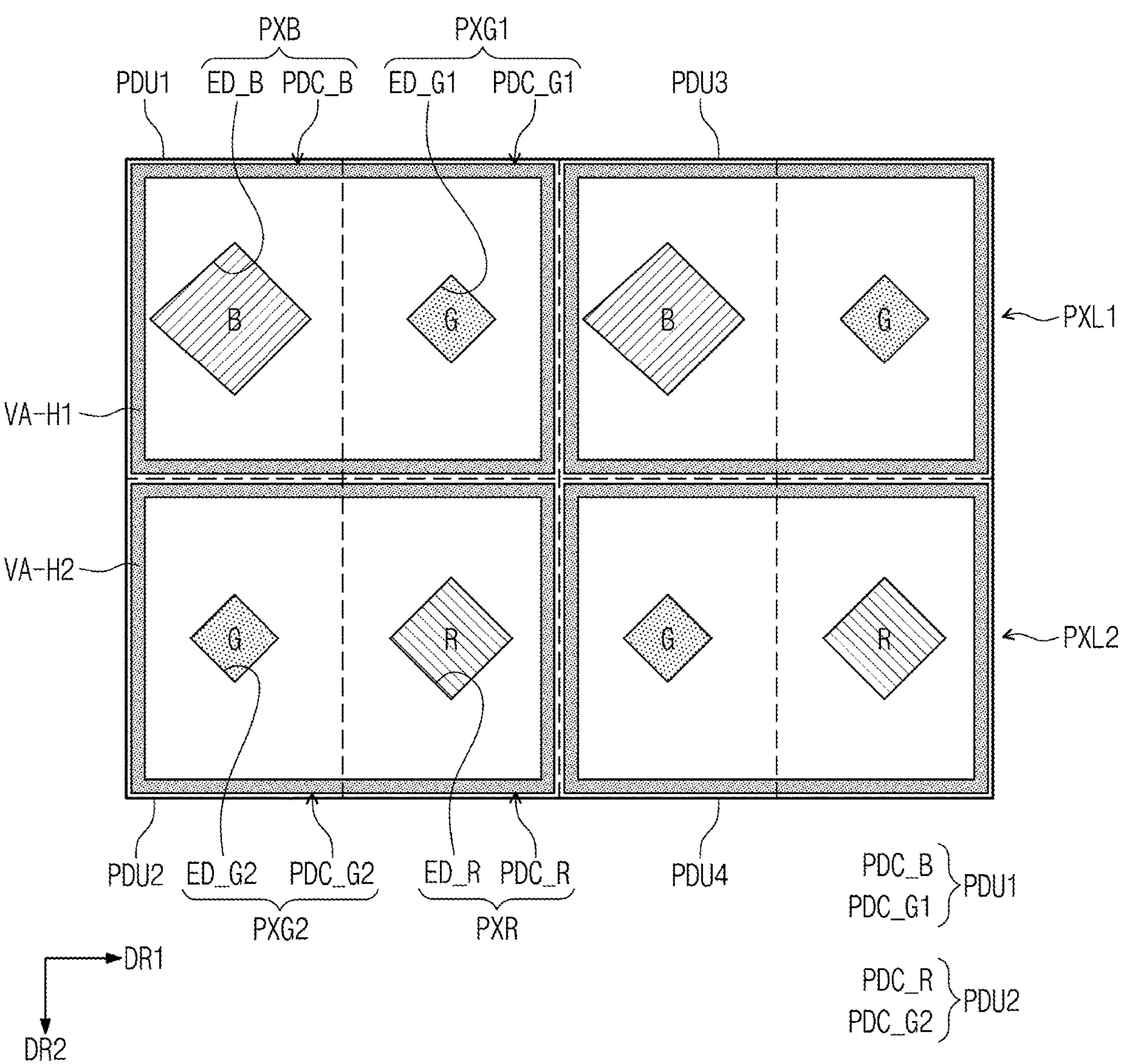
FIG. 6 is a plan view of adjacent pixels according to an embodiment of the inventive concept.

FIG. 6 is a plan view of adjacent pixels according to an embodiment of the inventive concept. The same/similar reference numerals are used for the same/similar components as those described with reference to FIG. 1A to FIG. 5, and redundant descriptions thereof are omitted.

FIG. 6 exemplarily illustrates eight pixels arranged along the first direction DR1 and the second direction DR2 among the pixels PX described with reference to FIG. 3. Pixels may have a structure of being repeatedly arranged by a predetermined rule in a first pixel row PXL1. For example, the first pixel row PXL1 may include a first pixel PXB and a 2-1 pixel PXG1.

The first pixel PXB and the 2-1 pixel PXG1 may be defined as a first unit pixel.

A second pixel row PXL2 is spaced apart from the first pixel row PXL1 in the second direction DR2, and pixels may have a structure of being repeatedly arranged by a predetermined rule in the second pixel row PXL2. For example, the second pixel row PXL2 may include a 2-2 pixel PXG2 and a third pixel PXR.

The 2-2 pixel PXG2 and the third pixel PXR may be defined as a second unit pixel.

The first pixel row PXL1 and the second pixel row PXL2 may each be extended along the first direction DR1 and be alternately disposed along the second direction DR2. Hereinafter, a redundant description of pixels disposed in the same pixel row will be omitted.

Referring to FIG. 6, the first pixel PXB of the first pixel row PXL1 may include a first pixel circuit PDC_B and a first light emitting element ED_B connected to the first pixel circuit PDC_B. The shape of the first light emitting element ED_B on a plane may correspond to the shape of the opening OP of the pixel definition film PDL described with reference to FIG. 5. Shapes of light emitting elements on a plane to be described below may be equally applied thereto. The first pixel circuit PDC_B may correspond to the pixel circuit PDC described with reference to FIG. 4.

The 2-1 pixel PXG1 of the first pixel row PXL1 may be spaced apart from the first pixel PXB along the first direction DR1. The 2-1 pixel PXG1 may include a 2-1 pixel circuit PDC_G1 and a 2-1 light emitting element ED_G1 connected to the 2-1 pixel circuit PDC_G1.

In the present embodiment, the first pixel circuit PDC_B and the 2-1 pixel circuit PDC_G1 adjacent thereto in the first direction DR1 may be defined as a first pixel circuit unit PDU1. Conductive patterns disposed in the first pixel circuit unit PDU1 of the first pixel row PXL1, for example, conductive patterns extended along the first direction DR1 among the scan lines, data lines, and power lines described with reference to FIG. 3 and FIG. 4, may be commonly disposed in the first pixel circuit unit PDU1.

The 2-2 pixel PXG2 of the second pixel row PXL2 may include a 2-2 pixel circuit PDC_G2 and a 2-2 light emitting element ED_G2 connected to the 2-2 pixel circuit PDC_G2.

The third pixel PXR of the second pixel row PXL2 may include a third pixel circuit PDC_R and a third light emitting element ED_R connected to the third pixel circuit PDC_R. The third pixel PXR may be spaced apart from the 2-2 pixel PXG2 along the first direction DR1.

In the present embodiment, the 2-2 pixel circuit PDC_G2 and the third pixel circuit PDC_R adjacent thereto in the first direction DR1 may be defined as a second pixel circuit unit PDU2. Conductive patterns disposed in the second pixel circuit unit PDU2 of the second pixel row PXL2, for example, conductive patterns extended along the first direction DR1 among the scan lines, data lines, and power lines described with reference to FIG. 3 and FIG. 4, may be commonly disposed in the second pixel circuit unit PDU2. In addition, among the conductive patterns, conductive patterns extended in the second direction DR2 may be commonly disposed in the first pixel circuit unit PDU1 and the second pixel circuit unit PDU2.

According to an embodiment, a third pixel circuit unit PDU3, which has a similar configuration to the first pixel circuit unit PDU1, is adjacent to the first pixel circuit unit PDU1 in the first pixel row PXL1. According to an embodiment, a fourth pixel circuit unit PDU4, which has a similar configuration to the second pixel circuit unit PDU2, is adjacent to the second pixel circuit unit PDU2 in the second pixel row PXL2.

According to an embodiment, the first pixel PXB may generate blue color light, the 2-1 pixel PXG1 and the 2-2 pixel PXG2 may generate the same green color light, and the third pixel PXR may generate red color light. However, this is exemplarily illustrated, and three or more pixel circuits may be disposed in one pixel circuit unit, and the inventive concept is not limited to any one embodiment.

According to the present embodiment, first valley holes VA-H1 may surround a corresponding first pixel circuit unit PDU1. Therefore, the first valley holes VA-H1 may define boundaries of the first pixel circuit units PDU1 which are adjacent in the first direction DR1.

Second valley holes VA-H2 may surround a corresponding second pixel circuit unit PDU2. Therefore, the second valley holes VA-H2 may define boundaries of the second pixel circuit units PDU2 which are adjacent in the first direction DR1.

A first valley hole VA-H1 and a second valley hole VA-H2 spaced apart along the second direction DR2 may define the boundary between a first pixel circuit unit PDU1 and a second pixel circuit unit PDU2 spaced apart along the second direction DR2.

According to the present embodiment, two first valley holes VA-H1 adjacent to each other in the first direction DR1 may have shapes symmetrical to each other with respect to a boundary. In addition, a first valley hole VA-H1 and a second valley hole VA-H2 adjacent to each other in the second direction DR2 may have shapes symmetrical to each other with respect to a boundary.

The first valley holes VA-H1 and the second valley holes VA-H2 according to an embodiment are illustrated as being spaced apart from each other, but first valley holes VA-H1 and second valley holes VA-H2 overlapping the boundary with adjacent pixel circuit units PDU1 and PDU2 may be defined as one hole, and are not limited to any one embodiment.

Each of the first valley holes VA-H1 and the second valley holes VA-H2 may correspond to the valley hole VA-H described with reference to FIG. 5. Therefore, each of the first valley holes VA-H1 and the second valley holes VA-H2 may short-circuit the first to sixth inorganic layers 10 to 60 (see FIG. 5) overlapping a corresponding pixel circuit unit. Therefore, the first to sixth inorganic layers 10 to 60 (see FIG. 5) disposed in each of the pixel circuit units PDU1 and PDU2 may be defined as being in a floating state. The floating state may be defined as being short-circuited in an island shape in addition to being electrically insulated.

According to the inventive concept, the valley holes VA-H1 and VA-H2 individually short-circuit the first to sixth inorganic layers 10 to 60 (see FIG. 5) disposed inside the pixel circuit units PDU1 and PDU2, so that external impacts or cracks may be prevented from being transferred to the pixel circuit units PDU1 and PDU2 through the first to sixth inorganic layers 10 to 60 (see FIG. 5). Accordingly, since external impacts or cracks are prevented from being transferred to the pixel circuit units PDU1 and PDU2, the display device DD (see FIG. 1) with improved durability may be provided.

Figure 7:
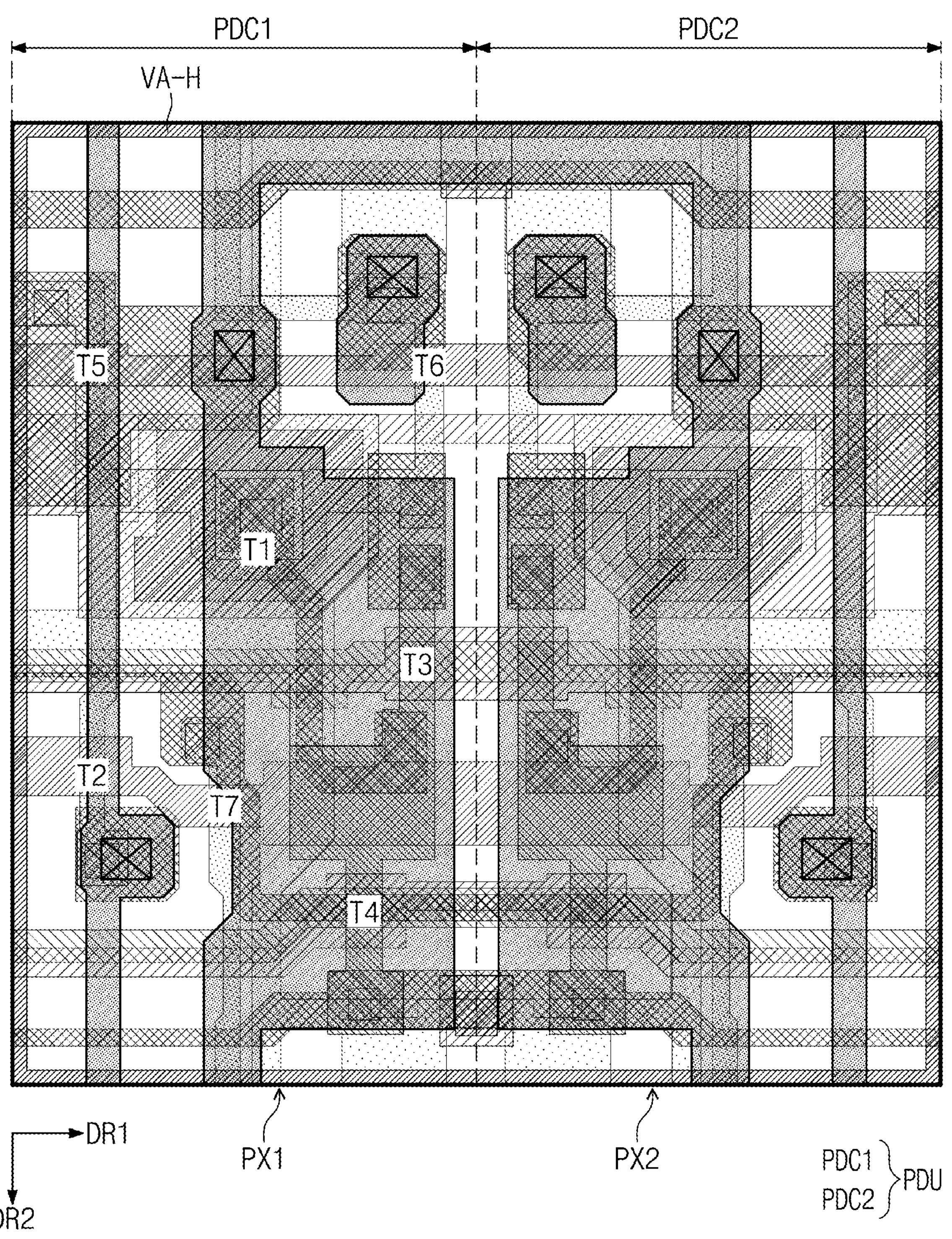
FIG. 7 is a plan view illustrating a stacking relationship of adjacent pixel circuits according to an embodiment of the inventive concept.

FIG. 7 is a plan view illustrating a stacking relationship of adjacent pixel circuits according to an embodiment of the inventive concept. FIG. 8A to FIG. 8H are plan views in accordance with a stacking order of patterns included in adjacent pixel circuits according to an embodiment of the inventive concept. The same/similar reference numerals are used for the same/similar components as those described with reference to FIG. 1A to FIG. 6, and redundant descriptions thereof are omitted.

FIG. 7 illustrates a plan view of pixel circuits PDC1 and PDC2 included in adjacent pixels PX1 and PX2. Each of the pixels PX1 and PX2 may have an equivalent circuit described with reference to FIG. 4. Therefore, each of the pixels PX1 and PX2 may include the first to seventh transistors T1 to T7. Conductive patterns and semiconductor patterns included in each of the pixels PX1 and PX2 may have a structure of being repeatedly arranged by a predetermined rule. Hereinafter, for the convenience of explanation, reference numerals will be omitted for the same elements among elements disposed in each of the pixels PX1 and PX2.

One pixel circuit unit PDU according to the inventive concept may be defined as including a first pixel circuit PDC1 and a second pixel circuit PDC2 disposed in two adjacent pixels PX1 and PX2. The valley hole VA-H according to an embodiment may surround the pixel circuit unit PDU and define the boundary with an adjacent pixel circuit unit. Therefore, the valley hole VA-H may surround the first pixel circuit PDC1 and the second pixel circuit PDC2.

FIG. 7 exemplarily illustrates one pixel circuit unit PDU, and the pixel circuit units PDU may be arranged in the first direction DR1 [DR2] and the second direction DR2 with a predetermined rule depending on the arrangement form of the pixels PX (see FIG. 3). In addition, valley holes VA-H surrounding each of the pixel circuit units PDU may be defined to correspond to the pixel circuit units PDU.

Figure 8A:
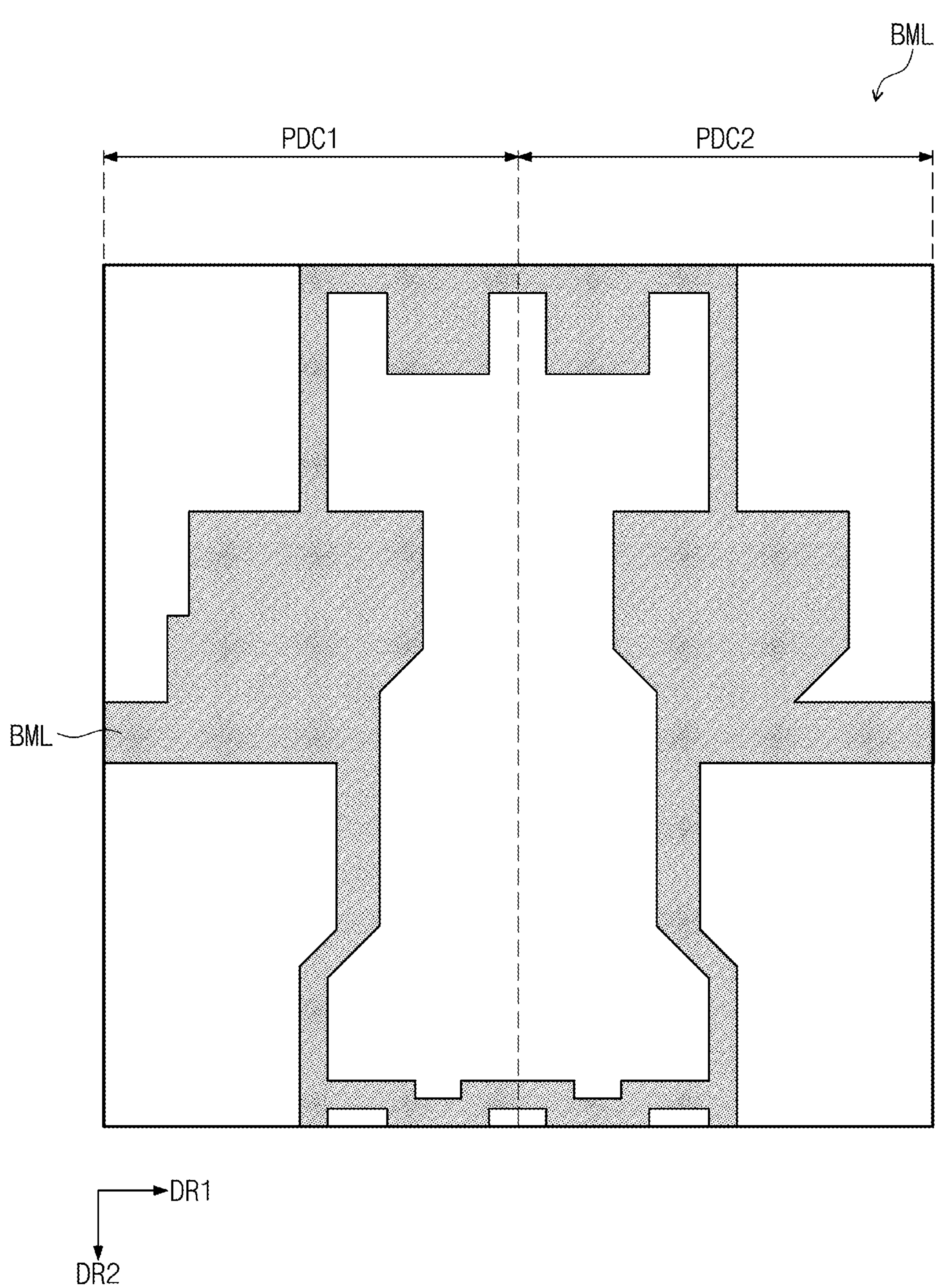
FIGS. 8A, 8B, 8C, 8D, 8E, 8F, 8G, and 8H are plan views in accordance with a stacking order of patterns included in adjacent pixel circuits according to an embodiment of the inventive concept.

Referring to FIG. 8A, FIG. 5, and FIG. 6, a light blocking pattern BML may be disposed between the lower inorganic layer BFL and the first inorganic layer 10. The light blocking pattern BML may include a metal. For example, the light blocking pattern BML be include molybdenum. The light blocking pattern BML may correspond to the first light blocking pattern BML1 described with reference to FIG. 5. The light blocking pattern BML may overlap an active of a P-type transistor among the first to seventh transistors T1 to T7. The light blocking pattern BML is disposed below a semiconductor pattern included in each of the first to seventh transistors T1 to T7, and thus, may perform the function of blocking light incident from the outside.

Referring to FIG. 8B, FIG. 8C, FIG. 5, and FIG. 6, a first semiconductor pattern SCP1 may be disposed between the first inorganic layer 10 and the second inorganic layer 20. The first semiconductor pattern SCP1 may include a plurality of regions with different doping concentrations.

Figure 8B:
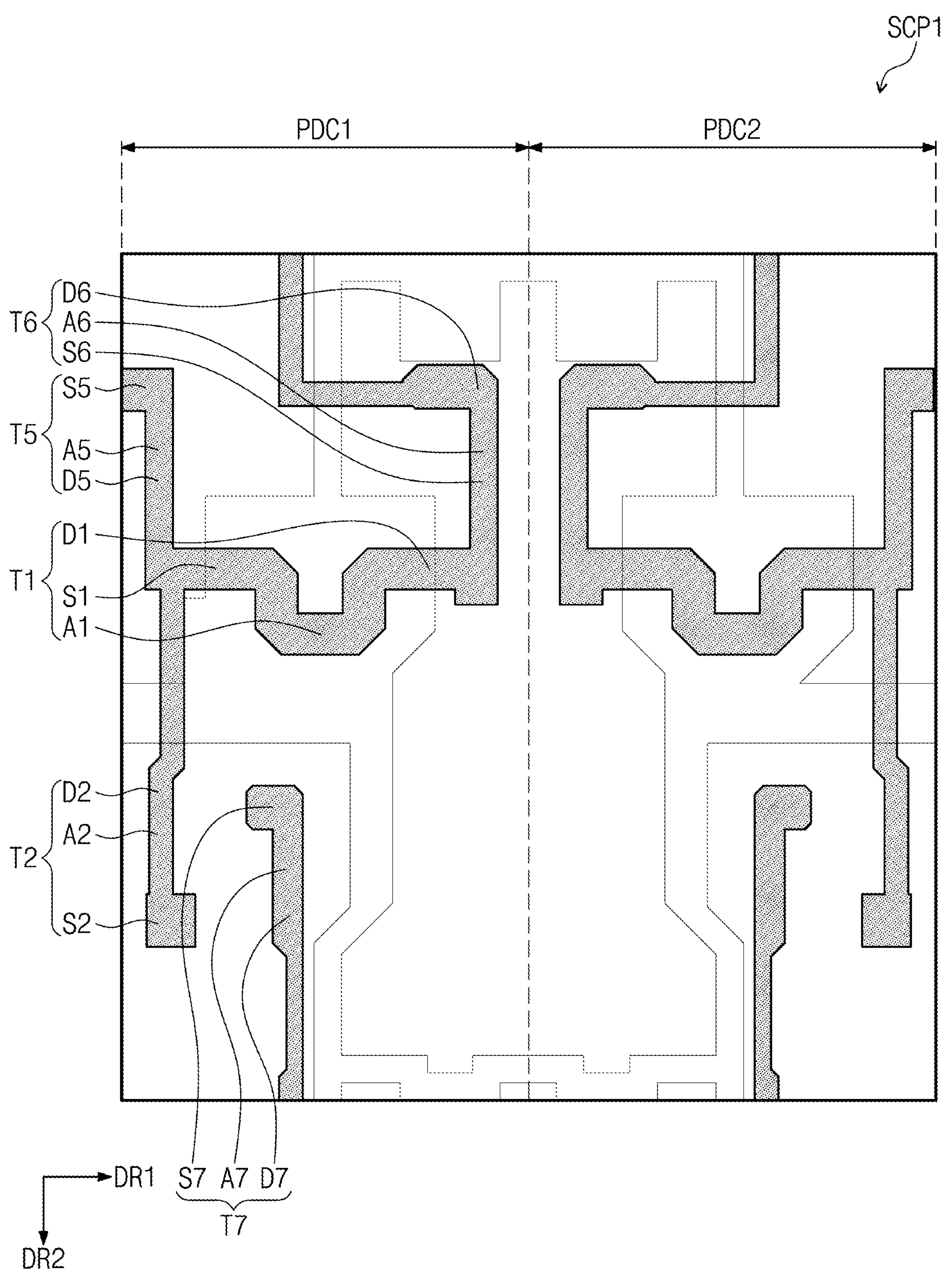

Referring to FIG. 8B, the first semiconductor pattern SCP1 may include a semiconductor pattern of each of the first, second, fifth, sixth, and seventh transistors T1, T2, T5, T6, and T7. The semiconductor patterns may respectively include sources S1, S2, S5, S6, and S7, actives A1, A2, A5, A6, and A7, and drains D1, D2, D5, D6, and D7. The actives A1, A2, A5, A6, and A7 may be defined as a region overlapping a first metal pattern MP1 to be described later.

The first semiconductor pattern SCP1 according to the inventive concept may include a silicon semiconductor. For example, the silicon semiconductor may include amorphous silicon, polycrystalline silicon, and the like. For example, the first semiconductor pattern SCP1 may include a low-temperature polycrystalline silicon LTPS.

According to the inventive concept, the first, second, fifth, sixth, and seventh transistors T1, T2, T5, T6, and T7 included in the first semiconductor pattern SCP1 may be P-type transistors, and the third and fourth transistors T3 and T4 included therein may be N-type transistors.

Specifically, the first transistor T1 which directly affects the brightness of the display device DD is configured to include a semiconductor pattern layer made of polycrystalline silicon having high reliability, through which a high-resolution display device DD may be implemented.

The connection signal line SCL described with reference to FIG. 5 may be defined as a portion of a pattern extended between the first, second, fifth, sixth, and seventh transistors T1, T2, T5, T6, and T7.

Figure 8C:
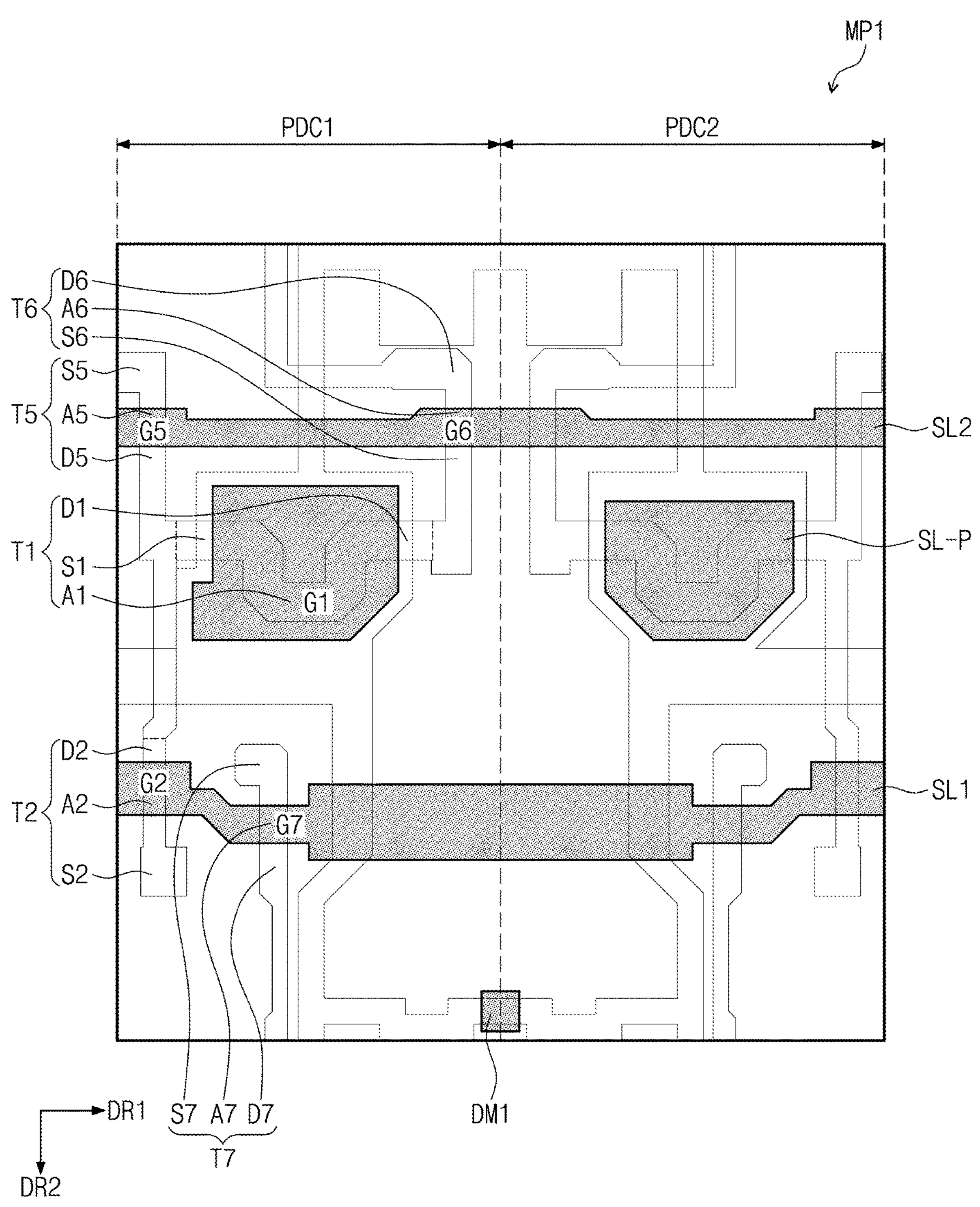

Referring to FIG. 8C, the first metal pattern MP1 is disposed between the second inorganic layer 20 and the third inorganic layer 30. The first metal pattern MP1 may include a first scan line SL1, a second scan line SL2, and a gate pattern SL-P. The first metal pattern SCP1 may go through a doping process using the first metal pattern MP1 as a mask. Therefore, in the first semiconductor pattern SCP1, a portion overlapping the first metal pattern MP1 may be defined as the active A1, A2, A5, A6, and A7.

In the first scan line SL1, a portion overlapping the active A2 of the second transistor T2 may be the gate G2, and in the first scan line SL1, a portion overlapping the active A7 of the seventh transistor T7 may be the gate G7. The first semiconductor pattern SCP1 overlapping the gate pattern SL-P may be the gate G1. In the second scan line SL2, a portion overlapping the active A5 of the fifth transistor T5 may be the gate G5, and in the second scan line SL2, a portion overlapping the active A6 of the sixth transistor T6 may be the gate G6.

The first metal pattern MP1 according to an embodiment may include a first dummy pattern DM1. The first dummy pattern DM1 may be in a floating state with respect to the first metal pattern MP1.

Figure 8D:
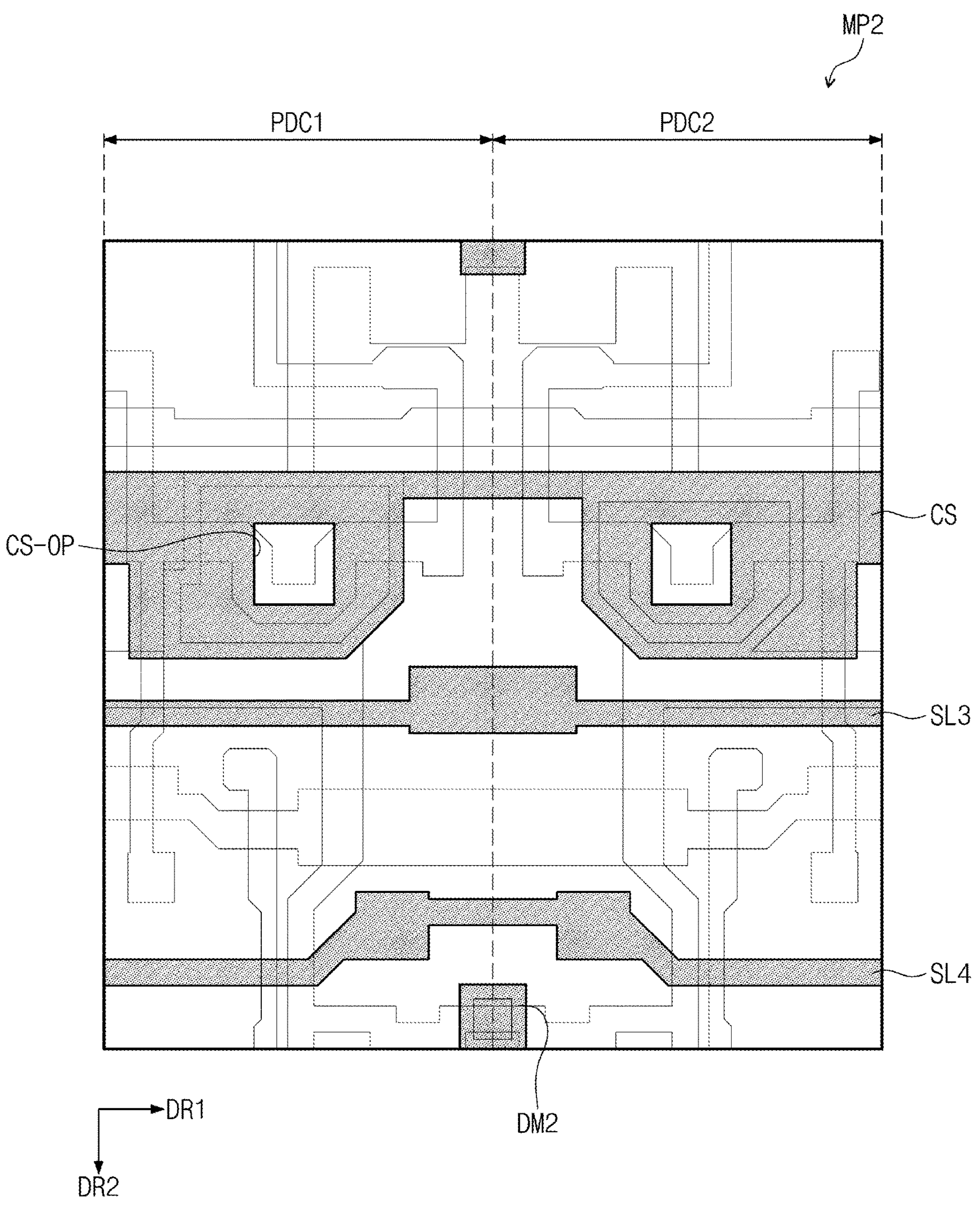

Referring to FIG. 8D, FIG. 5, and FIG. 6, a second metal pattern MP2 is disposed between the third inorganic layer 30 and the fourth inorganic layer 40. The second metal pattern MP2 may include a first compensation pattern SL3, a second compensation pattern SL4, and an upper electrode pattern CS.

In the upper electrode pattern CS, a portion of the second metal pattern MP2 overlapping the gate G1 may be the upper electrode UE described with reference to FIG. 5. The remaining portion of the upper electrode pattern CS may define the capacitor Cst (see FIG. 3) together with the gate G1 of the first transistor T1.

In the upper electrode pattern CS, an electrode opening CS-OP penetrating the upper electrode pattern CS may be formed, and the gate pattern SL-P may be exposed by the electrode opening CS-OP.

The first compensation pattern SL3 and the second compensation pattern SL4 overlap a third scan line SL5 and a fourth scan line SL6 to be described later, and are connected through a contact-hole to reduce the resistance of the third scan line SL5 and the fourth scan line SL6. In addition, the first compensation pattern SL3 and the second compensation pattern SL4 may serve to block light incident on the third scan line SL5 and the fourth scan line SL6.

The second metal pattern MP2 according to an embodiment may further a second dummy pattern DM2. The second dummy pattern DM2 may overlap the first dummy pattern DM1.

Figure 8E:
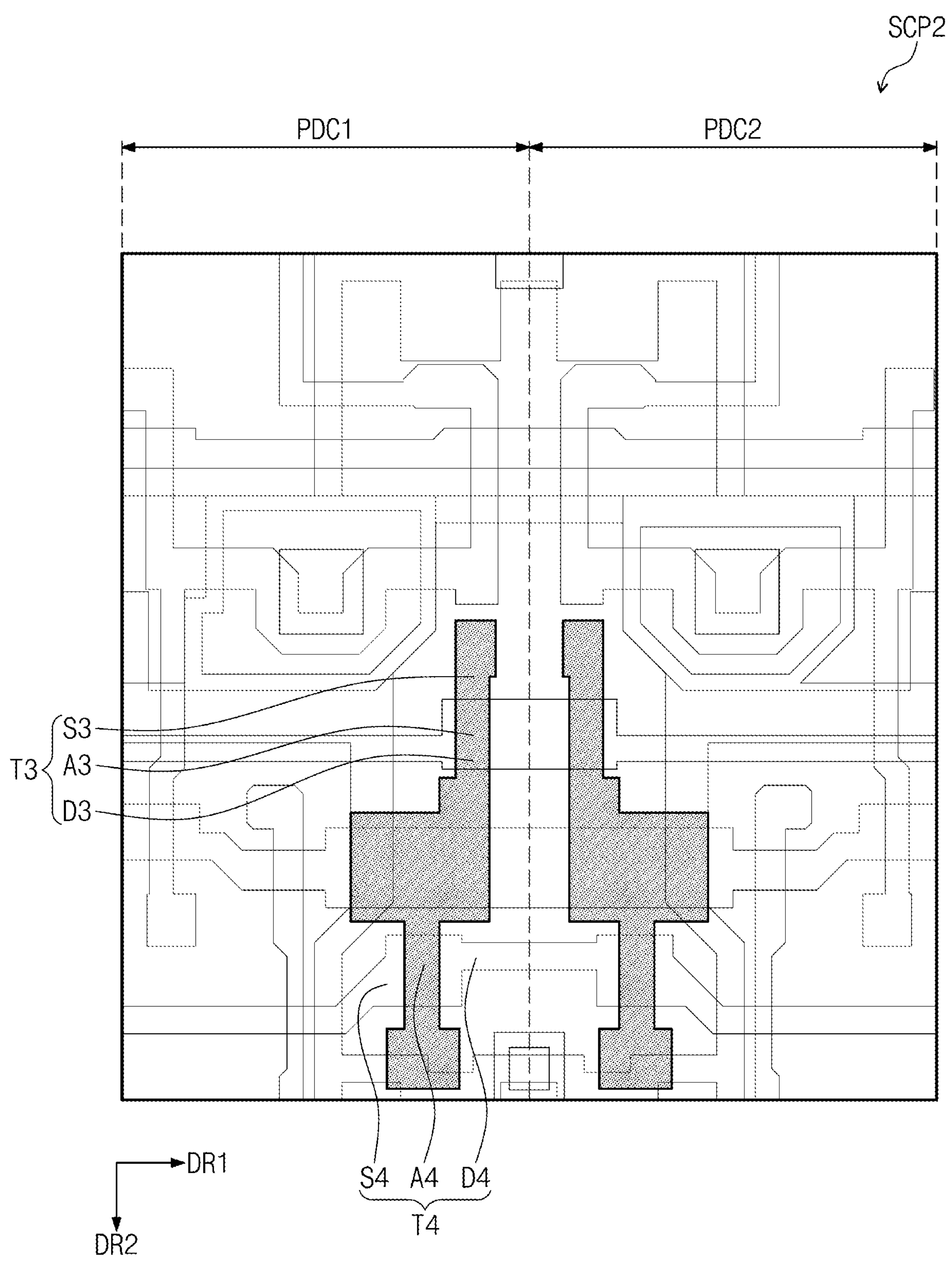

Referring to FIG. 8E, FIG. 5, and FIG. 6, a second semiconductor pattern SCP2 may be disposed between the fourth inorganic layer 40 and the fifth inorganic layer 50. The second semiconductor pattern SCP2 may include a plurality of regions distinguished according to whether a metal oxide has been reduced or not.

The second semiconductor pattern SCP2 may include a semiconductor pattern of each of the third and fourth transistors T3 and T4. The semiconductor patterns may respectively include sources S3 and S4, actives A3 and A4, and drains D3 and D4. The actives A3 and A4 may be defined as a region overlapping a third metal pattern MP3 to be described later. The active A4 of the fourth transistor T4 is extended from the active A3 of the third transistor T3.

In the second semiconductor pattern SCP2, regions other than the third and fourth transistors T3 and T4 may be defined as a connection signal line. Any one connection signal line is extended from the source S3 of the third transistor T3 to the drain D4 of the fourth transistor T4. The connection signal line is connected to the gate G1 of the first transistor T1 through a contact-hole defined in the fourth inorganic layer 40.

The drain D3 of the third transistor T3 is connected to the source S6 of the sixth transistor T6 through the contact-hole defined in the fourth inorganic layer 40.

Figure 8F:
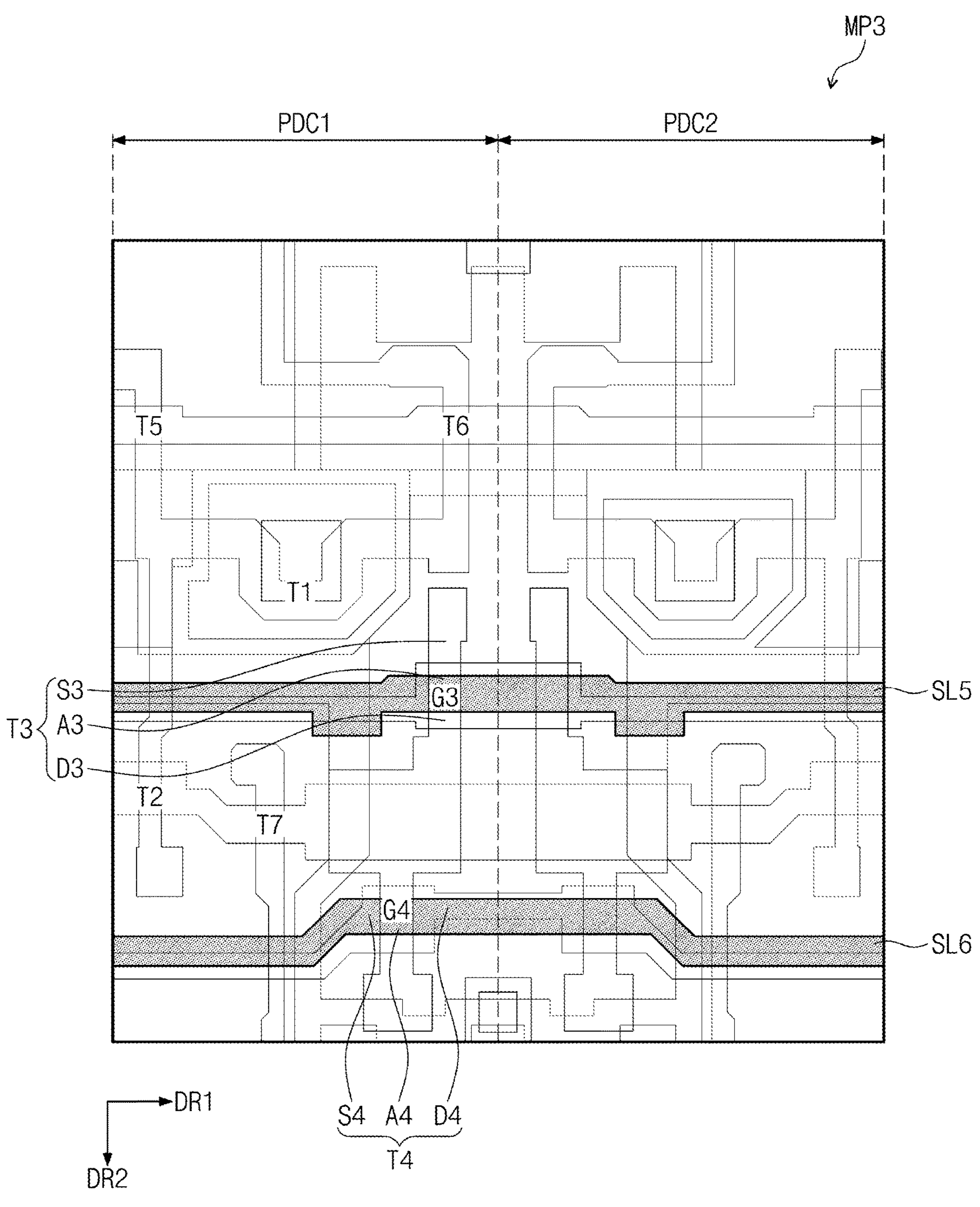

Referring to FIG. 8F, the third metal pattern MP3 is disposed between the fifth inorganic layer 60 and the sixth inorganic layer 60. The third metal pattern MP3 may include the third scan line SL5 and the fourth scan line SL6.

The second semiconductor pattern SCP2 may go through a doping process using the third metal pattern MP3 as a mask. Therefore, in the second semiconductor pattern SCP2, a portion overlapping the third metal pattern MP3 may be defined as the active A3 and A4.

In the third scan line SL5, a portion overlapping the active A3 of the third transistor T3 may be the gate G3, and in the fourth scan line SL6, a portion overlapping the active A4 of the fourth transistor T4 may be the gate G4. The third scan line SL5 may correspond to the i-th scan line GLi of the second group of FIG. 5, and the fourth scan line SL6 may correspond to the i-th scan line HLi of the third group.

In the inventive concept, the second semiconductor pattern SCP2 may include an oxide semiconductor. The third and fourth transistors T3 and T4 may be N-type transistors. The oxide semiconductor pattern has high carrier mobility and low leakage current, and thus, does not have a significant voltage drop even when driving time is long. That is, since there is no significant change in the color of an image due to a voltage drop even during low-frequency driving, low-frequency driving is possible.

Since the oxide semiconductor pattern has the advantage of low leakage current as described above, at least one of the third transistor T3 and the fourth transistor T4 which are connected to a driving gate electrode of the first transistor T1 may be employed as an oxide semiconductor pattern to prevent leakage current which may flow to the driving gate electrode and to reduce power consumption.

Figure 8G:
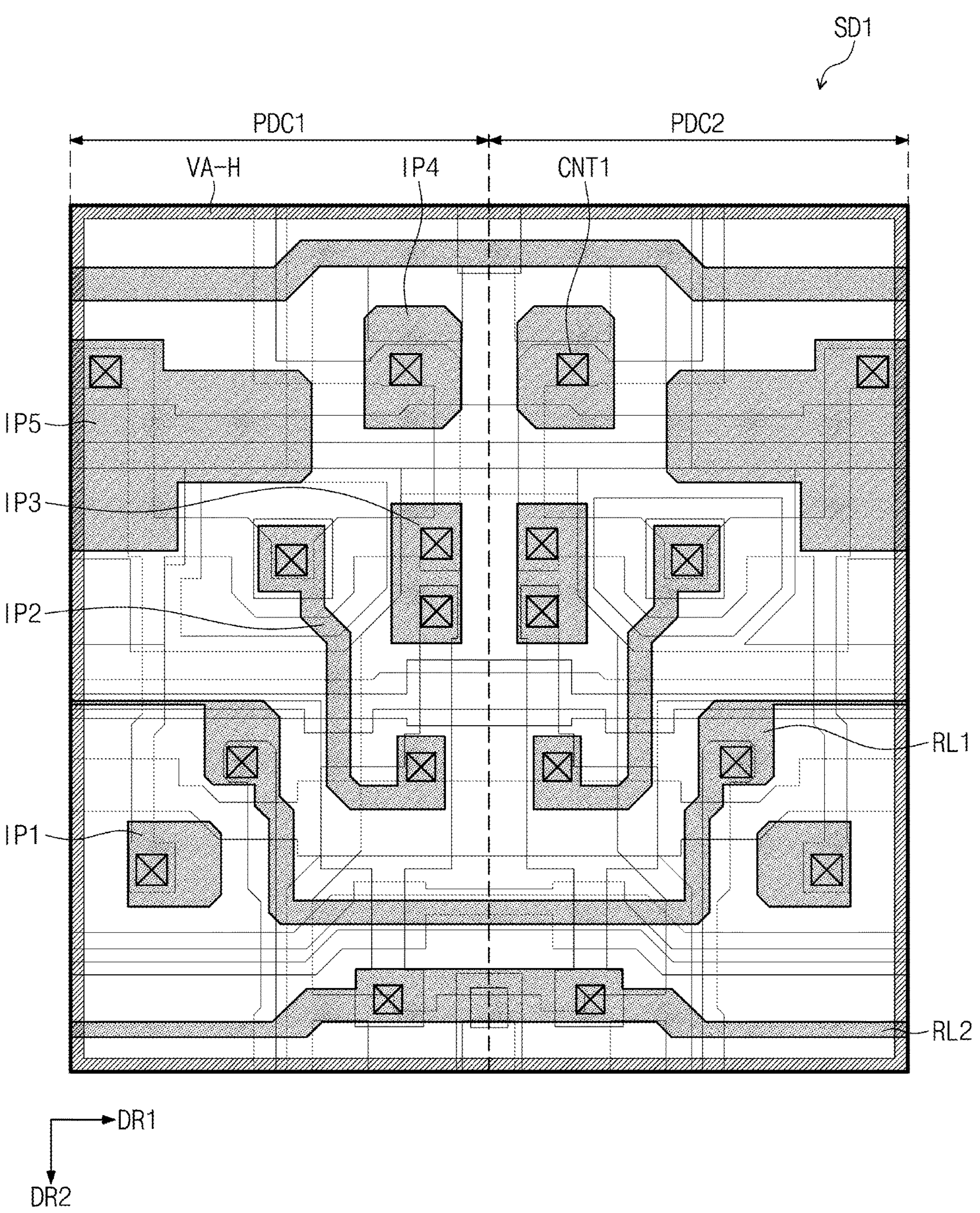

Referring to FIG. 8G, a fourth metal pattern SD1 is disposed between the sixth inorganic layer 60 and the first organic layer 71. The fourth metal pattern SD1 may include the third scan line SL5 and the fourth scan line SL6. FIG. 8G illustrates first contact-holes CNT1 defined by penetrating at least some of the first to sixth inorganic layers 10 to 60 illustrated in FIG. 5. At least one of the first contact-holes CNT1 may correspond to the first contact-hole CH1 described with reference to FIG. 5.

A first voltage line RL1, a second voltage line RL2, a first transfer pattern IP1, a second transfer pattern IP2, a third transfer pattern IP3, a fourth transfer pattern IP4, and a fifth transfer pattern IP5 may be included. The fourth metal pattern SD1 may include a plurality of first contact-holes CNT1 defined by penetration of the fourth metal pattern SD1.

The first voltage line RL1 and the second voltage line RL2 may receive the same signal as each other. For example, each of the first voltage line RL1 and the second voltage line RL2 may correspond to the second voltage line RL described with reference to FIG. 4 and receive the initialization voltage Vint. However, the embodiment of the inventive concept is not limited thereto, and the first voltage line RL1 and the second voltage line RL2 may receive initialization voltages having different levels from each other.

The first transfer pattern IP1 may be in contact with the first semiconductor pattern SCP1 through a corresponding contact-hole CNT1. A data line DL to be described later may transmit a data signal to the first semiconductor pattern SCP1 through the first transfer pattern IP1.

The second transfer pattern IP2 may be connected to the gate pattern SL-P and the second semiconductor pattern SCP2 through corresponding first contact-holes CNT1 respectively formed on one side and the other side.

The third transfer pattern IP3 may be connected to the first semiconductor pattern SCP1 and the second semiconductor pattern SCP2 through the corresponding first contact-holes CNT1 respectively formed on one side and the other side.

The fourth transfer pattern IP4 may be connected to a corresponding first contact-hole CNT1 to the first semiconductor pattern SCP1. The fourth transfer pattern IP4 may transfer a driving current or the initialization voltage Vint from the first semiconductor pattern SCP1 to the light emitting element OLED.

The fifth transfer pattern IP5 may be in contact with the first semiconductor pattern SCP1 and the upper electrode pattern CS through the first contact-holes CNT1 respectively formed on one side and the other side. The first power voltage ELVDD may be transferred to the first semiconductor pattern SCP1 through the fifth transfer pattern IP5.

According to the inventive concept, the valley hole VA-H may be formed by penetrating at least some of the first to sixth inorganic layers 10 to 60 illustrated in FIG. 5. The valley hole VA-H may be formed by the same process as a process of forming the first contact hole CNT1. Therefore, the valley hole VA-H may be formed with the same mask as a mask used for forming the first contact-hole CNT1.

The valley hole VA-H may not overlap the first contact-hole CNT1. Accordingly, the valley hole VA-H may not expose the first semiconductor pattern SCP1. The valley hole VA-H according to an embodiment may surround the pixel circuit unit PDU. Therefore, in the inorganic layers 10 to 60 illustrated in FIG. 5, a portion disposed on an inner side of the valley hole VA-H may be in a floating state with respect to a portion disposed on an outer side of the valley hole VA-H.

According to the inventive concept, the valley hole VA-H may short-circuit the first to sixth inorganic layers 10 to 60 (see FIG. 5) disposed in the pixel circuit unit PDU. Therefore, the pixels PX1 and PX2 (see FIG. 7) included in the pixel circuit unit PDU may prevent external impacts or cracks from being transferred to the pixel circuit unit PDU through the first to sixth inorganic layers 10 to 60 (see FIG. 5). Accordingly, since external impacts or cracks are prevented from being transferred to a unit pixel, the display device DD (see FIG. 1) with improved durability may be provided.

Figure 8H:
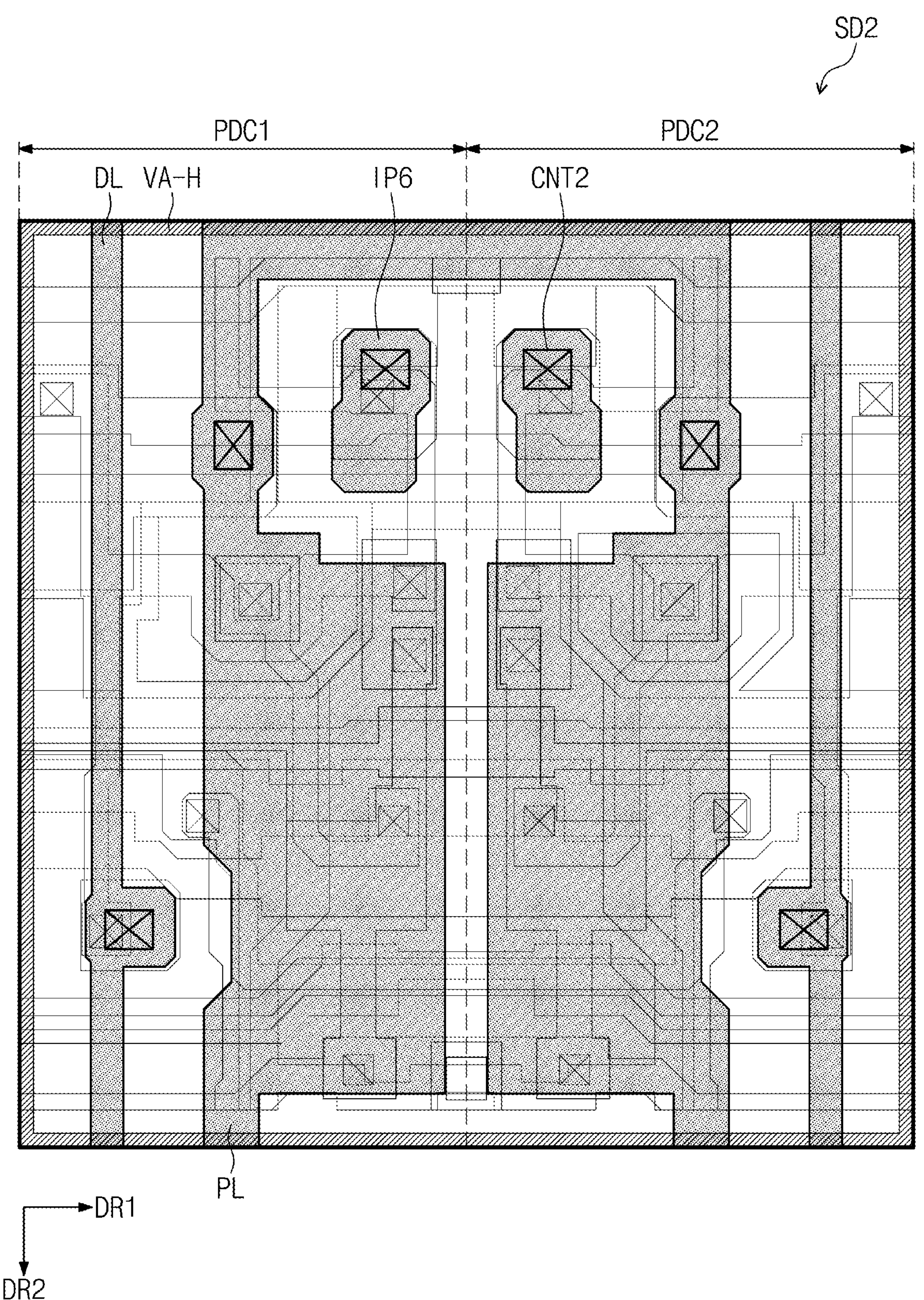

Referring to FIG. 8H, a fifth metal pattern SD2 is disposed between the first organic layer 71 and the second organic layer 72. The fifth metal pattern SD2 may include the data line DL, a voltage line PL, and a sixth transfer pattern IP6. The fifth metal pattern SD2 may include a plurality of second contact-holes CNT2 defined by penetration of the fifth metal pattern SD2.

The data line DL may correspond to the j-th data line DLj of FIG. 4, and the voltage line PL may correspond to the first voltage line PL.

The sixth transfer pattern IP6 may be connected to the fourth transfer pattern IP4 through the second contact hole CNT2, and the first electrode AE (see FIG. 5) of the light emitting element OLED (see FIG. 5) may be connected to the first semiconductor pattern SCP1 through the sixth transfer pattern IP6. The voltage line PL may be connected to the fifth transfer pattern IP5 through the second contact-hole CNT2. The data line DL may be connected to the first transfer pattern IP1 through the second contact-hole CNT2.

Figure 9:
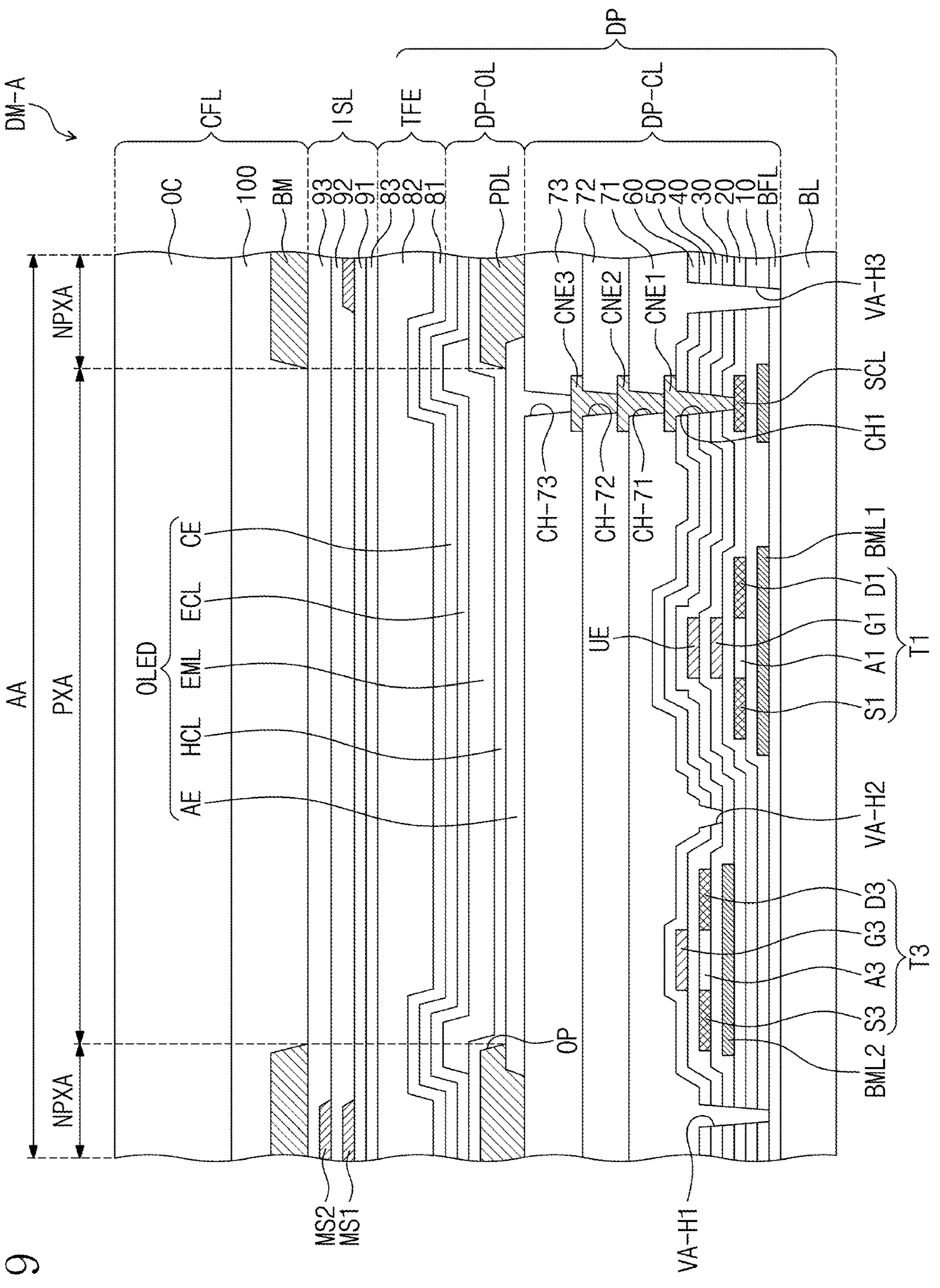
FIG. 9 is a cross-sectional view of a display module according to an embodiment of the inventive concept.

FIG. 9 is a cross-sectional view of a display module according to an embodiment of the inventive concept. The same/similar reference numerals are used for the same/similar components as those described with reference to FIG. 5 to FIG. 8H, and redundant descriptions thereof will be omitted. FIG. 9 is a cross-sectional view of a region corresponding to FIG. 5.

A display module DM-A according to an embodiment may include a display panel DP, an input sensing layer ISL, and a filter layer CFL. The display panel DP may include a base layer BL, a circuit layer DP-CL, an element layer DP-OL, and an encapsulation layer TFE. The display panel DP, the input sensing layer ISL, and the filter layer CFL may be included. Descriptions of the base layer BL, the circuit layer DP-CL, the element layer DP-OL, and the encapsulation layer TFE may correspond to those described with reference to FIG. 5, and differences therefrom will be mainly described.

The display module DM-A according to an embodiment may include first to third valley holes VA-H1, VA-H2, and VA-H3 having different thicknesses from each other. Each of the first to third valley holes VA-H1, VA-H2, and VA-H3 may not overlap an active pattern included in the first transistor T1 and/or contact-holes CH1 defined such that a connection signal line SCL is connected to a first electrode AE of a light emitting element OLED.

The first valley hole VA-H1 may penetrate first to sixth inorganic layers 10 to 60 to expose a lower inorganic layer BFL. A portion of a first organic layer 71 may be disposed inside the first valley hole VA-H1 to be in contact with the exposed lower inorganic layer BFL.

The second valley hole VA-H2 (which may be referred to as a sub-valley hole) may penetrate the fifth to sixth inorganic layers 50 and 60 to expose the fourth inorganic layer 40. A portion of the first organic layer 71 may be disposed inside the second valley hole VA-H2 to be in contact with the exposed fourth inorganic layer 40. In the third direction DR3, a depth of the second valley hole VA-H2 may be smaller than a depth of the first valley hole VA-H1.

The third valley holes VA-H3 may be formed by penetrating not only the first to sixth inorganic layers 10 to 60, but also the lower inorganic layer BFL. The penetration of the lower inorganic layer BFL by the third valley hole VA-H3 may have caused by repeatedly performing a process of forming the first valley hole VA-H1, and then forming the second valley hole VA-H2 on the first valley hole VA-H1. A lower valley hole overlapping a valley hole penetrating the first to sixth inorganic layers 10 to 60 may be defined on the lower inorganic layer BFL. The valley hole and the lower valley hole may overlap each other to define the third valley hole VA-H3.

The third valley hole VA-H3 may expose the base layer BL. A portion of the first organic layer 71 may be disposed inside the third valley hole VA-H3 to be in contact with the exposed base layer BL. In the third direction DR3, a depth of the third valley hole VA-H3 may be greater than a depth of the first valley hole VA-H1.

Figure 10:
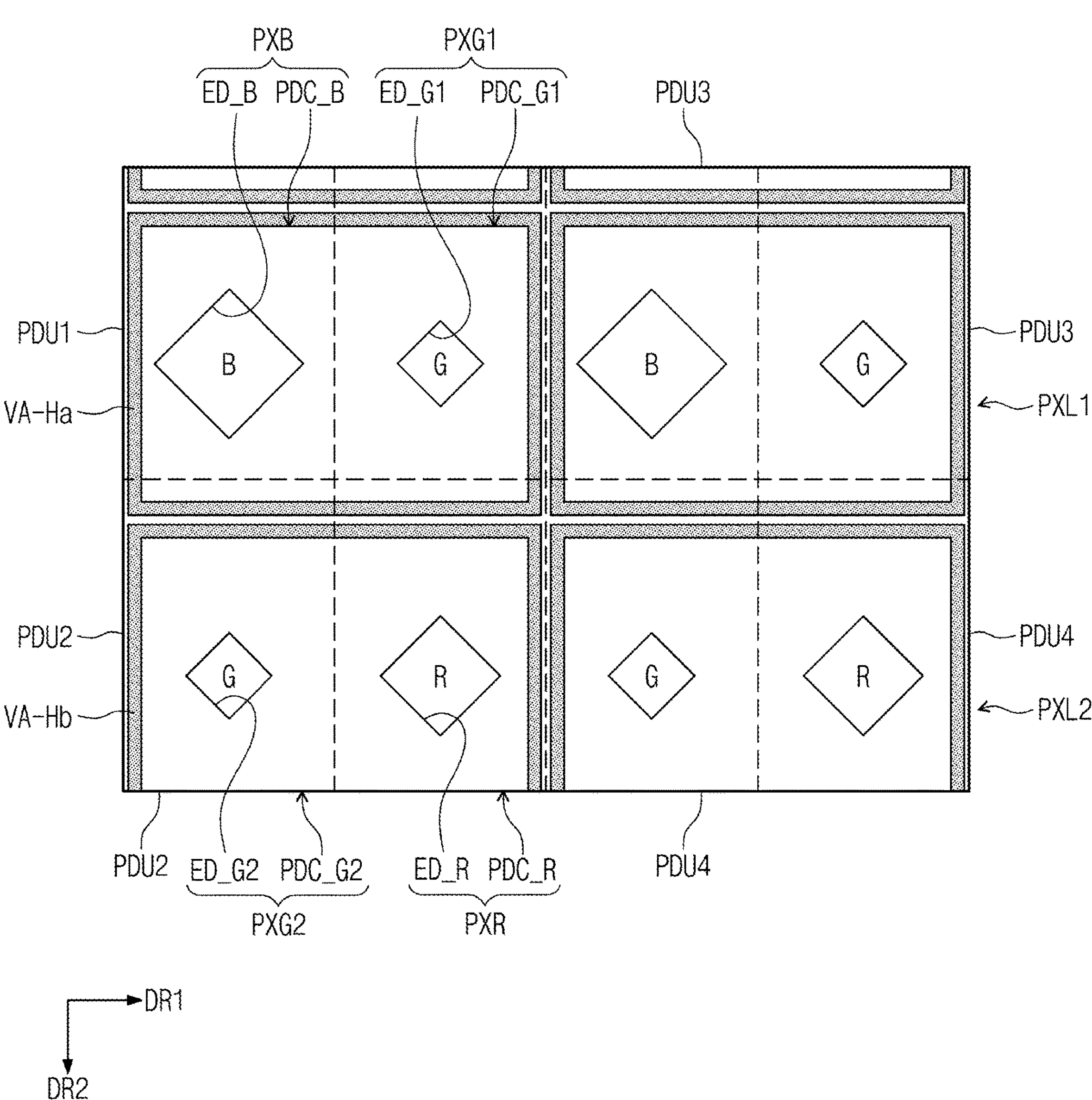
FIG. 10 is a plan view of adjacent pixels according to an embodiment of the inventive concept.

FIG. 10 is a plan view of adjacent pixels according to an embodiment of the inventive concept. FIG. 10 is a plan view of a region corresponding to FIG. 6. Therefore, differences therefrom will be mainly described.

Referring to FIG. 10, pixels may have a structure of being repeatedly arranged by a predetermined rule in a first pixel row PXL1. For example, the first pixel row PXL1 may include a first pixel PXB and a 2-1 pixel PXG1.

A second pixel row PXL2 is spaced apart from the first pixel row PXL1 in the second direction DR2, and pixels may have a structure of being repeatedly arranged by a predetermined rule in the second pixel row PXL2. For example, the second pixel row PXL2 may include a 2-2 pixel PXG2 and a third pixel PXR.

The first pixel row PXL1 and the second pixel row PXL2 may each be extended along the first direction DR1 and be alternately disposed along the second direction DR2. Hereinafter, a redundant description of pixels disposed in the same pixel row will be omitted.

Referring to FIG. 10, the first pixel PXB of the first pixel row PXL1 may include a first pixel circuit PDC_B and a first light emitting element ED_B connected to the first pixel circuit PDC_B.

The 2-1 pixel PXG1 of the first pixel row PXL1 may be spaced apart from the first pixel PXB along the first direction DR1. The 2-1 pixel PXG1 may include a 2-1 pixel circuit PDC_G1 and a 2-1 light emitting element ED_G1 connected to the 2-1 pixel circuit PDC_G1.

In the present embodiment, the first pixel circuit PDC_B and the 2-1 pixel circuit PDC_G1 adjacent thereto in the first direction DR1 may be defined as a first pixel circuit unit PDU1. Conductive patterns disposed in the first pixel circuit unit PDU1 of the first pixel row PXL1, for example, conductive patterns extended along the first direction DR1 among the scan lines, data lines, and power lines described with reference to FIG. 3 and FIG. 4, may be commonly disposed in the first pixel circuit unit PDU1.

The 2-2 pixel PXG2 of the second pixel row PXL2 may include a 2-2 pixel circuit PDC_G2 and a 2-2 light emitting element ED_G2 connected to the 2-2 pixel circuit PDC_G2.

The third pixel PXR of the second pixel row PXL2 may include a third pixel circuit PDC_R and a third light emitting element ED_R connected to the third pixel circuit PDC_R. The third pixel PXR may be spaced apart from the 2-2 pixel PXG2 along the first direction DR1.

In the present embodiment, the 2-2 pixel circuit PDC_G2 and the third pixel circuit PDC_R adjacent thereto in the first direction DR1 may be defined as a second pixel circuit unit PDU2. Conductive patterns disposed in the second pixel circuit unit PDU2 of the second pixel row PXL2, for example, conductive patterns extended along the first direction DR1 among the scan lines, data lines, and power lines described with reference to FIG. 3 and FIG. 4, may be commonly disposed in the second pixel circuit unit PDU2. In addition, among the conductive patterns, conductive patterns extended in the second direction DR2 may be commonly disposed in the first pixel circuit unit PDU1 and the second pixel circuit unit PDU2.

According to an embodiment, the first pixel PXB may generate blue color light, the 2-1 pixel PXG1 and the 2-2 pixel PXG2 may generate the same green color light, and the third pixel PXR may generate red color light. However, this is exemplarily illustrated, and three or more pixel circuits may be disposed in one pixel circuit unit, and the inventive concept is not limited to any one embodiment.

According to the present embodiment, a portion of each of first valley holes VA-Ha may overlap a portion of a corresponding first pixel circuit unit PDU1, and the remaining portion of each of the first valley holes VA-Ha may overlap a portion of a corresponding second pixel circuit unit PDU2.

A portion of each of second valley holes VA-Hb may overlap the remaining portion of the first pixel circuit unit PDU1, and the remaining portion of each of the second valley holes VA-Hb may overlap the remaining portion of the second pixel circuit unit PDU2. Therefore, the first valley holes VA-Ha and the second valley holes VA-Hb may be shifted from corresponding first and second pixel circuit units PDU1 and PDU2 in the second direction DR2. However, the embodiment of the inventive concept is not limited thereto, and the first valley holes VA-Ha and the second valley holes VA-Hb may be shifted from corresponding first and second pixel circuit units PDU1 and PDU2 in the first direction DR1.

According to the present embodiment, two first valley holes VA-Ha adjacent to each other in the first direction DR1 may have shapes symmetrical to each other with respect to a boundary. In addition, a first valley hole VA-Ha and a second valley hole VA-Hb adjacent to each other in the second direction DR2 may have shapes symmetrical to each other with respect to a boundary.

The first valley holes VA-Ha and the second valley holes VA-Hb according to an embodiment are illustrated as being spaced apart from each other, but first valley holes VA-Ha and second valley holes VA-Hb overlapping the boundaries of adjacent pixel circuit units PDU1 and PDU2 may be defined as one hole, and are not limited to any one embodiment.

Figure 11:
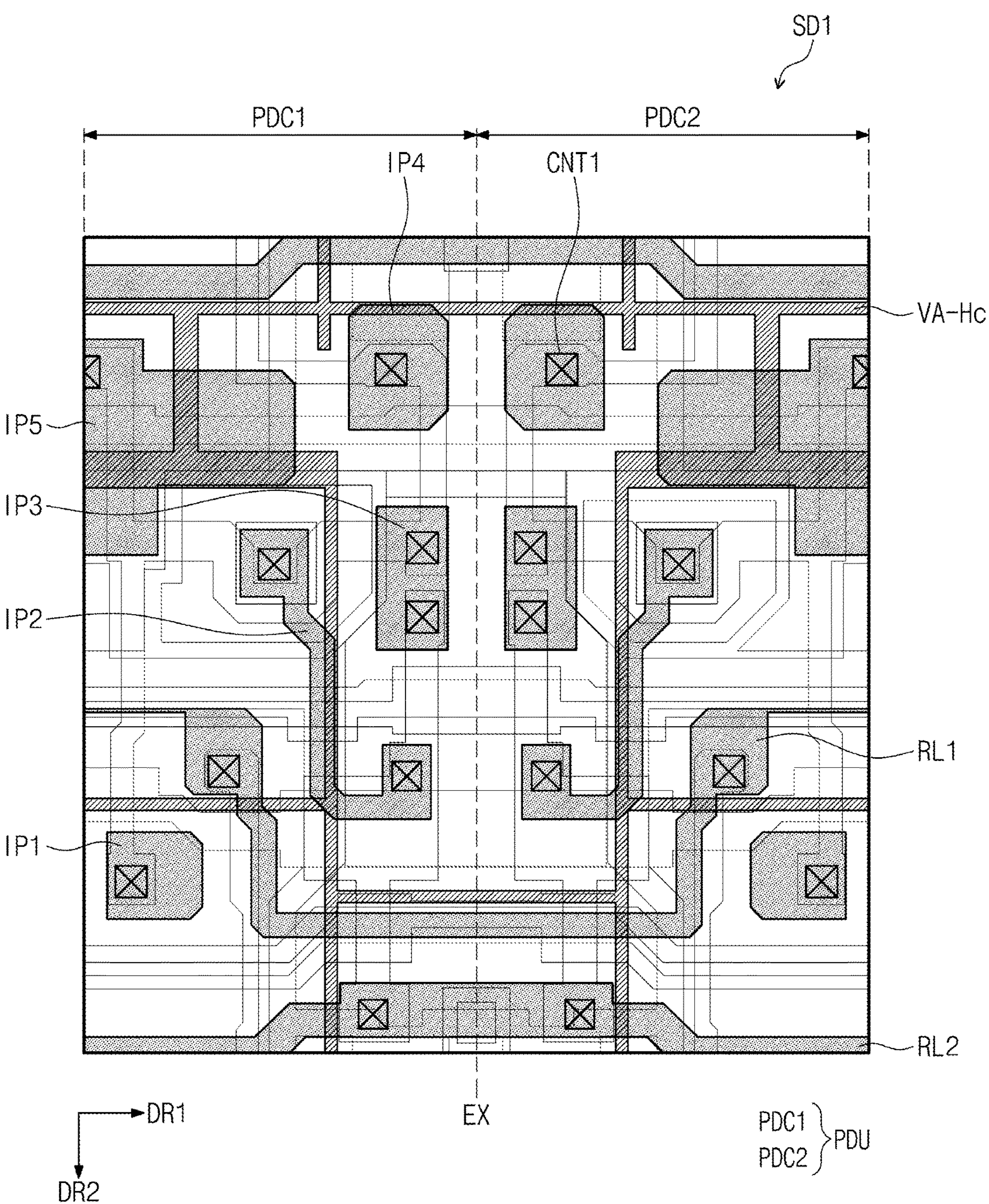
FIG. 11 is a plan view of a valley hole according to an embodiment of the inventive concept.

FIG. 11 is a plan view of a valley hole according to an embodiment of the inventive concept. FIG. 11 is a plan view illustrating a layer corresponding FIG. 8G. Redundant descriptions will be omitted and only differences will be described.

According to the present embodiment, a valley hole VA-Hc may be formed by penetrating at least some of the first to sixth inorganic layers 10 to 60 illustrated in FIG. 5. The valley hole VA-Hc may be formed by the same process as a process of forming a first contact hole CNT1. Therefore, the valley hole VA-Hc may be formed with the same mask as a mask used for forming the first contact-hole CNT1.

The valley hole VA-Hc according to the present embodiment may have atypical shapes in first and second pixel circuits PDC1 and PDC2. In addition, the valley hole VA-Hc may have shapes symmetrical to each other along a boundary EX between the first and the second pixel circuits PDC1 and PDC2.

According to the inventive concept, since a valley hole for short-circuiting inorganic layers disposed in a pixel circuit unit is included, external impacts or cracks may be prevented from being transferred to a pixel circuit through the inorganic layers. Accordingly, a display device with improved durability may be provided.

Although the present invention has been described with reference to embodiments, it will be understood by those skilled in the art that various modifications and changes in form and details may be made therein without departing from the scope and spirit of the present invention as set forth in the following claims.

What is claimed is:

1. A display device comprising:

a base layer;

a lower inorganic layer disposed on the base layer;

a pixel circuit unit disposed on the lower inorganic layer and including a first pixel circuit and a second pixel circuit, each of the first pixel circuit and the second pixel circuit including semiconductor patterns and conductive patterns;

inorganic layers disposed on the lower inorganic layer and having contact-holes exposing the semiconductor patterns;

first connection electrodes disposed in the contact-holes and on the inorganic layers, the first connection electrodes connected to the semiconductor patterns;

a first organic layer disposed on the inorganic layers and at least partially covering the first connection electrodes;

a first light emitting element connected to the first pixel circuit by a first connection electrode of the first pixel circuit; and a second light emitting element connected to the second pixel circuit by a first connection electrode of the second pixel circuit, wherein a valley hole through the inorganic layers exposes the lower inorganic layer, the valley hole does not overlap the contact holes in a plan view, the first organic layer is disposed in the valley hole and in contact with the lower inorganic layer, the first pixel circuit includes a first transistor and a second transistor, and a sub-valley hole is disposed between the first transistor and the second transistor.

2. The display device of claim 1, wherein:

the valley hole surrounds the pixel circuit unit in the plan view; and side surfaces of the inorganic layers defining the valley hole define a boundary of the pixel circuit unit.

3. The display device of claim 1, wherein the lower inorganic layer has a lower valley hole defined thereon which corresponds to the portion of the valley hole, wherein the valley hole and the lower valley hole expose the base layer.

4. The display device of claim 3, wherein the first organic layer disposed in the lower valley hole is in contact with the exposed base layer.

5. The display device of claim 1, wherein:

the inorganic layers comprise first, second, third, fourth, fifth, and sixth inorganic layers sequentially stacked on the lower inorganic layer;

the semiconductor patterns comprise first and second semiconductor patterns each including a source, an active, and a drain; and the first pixel circuit includes:

the first transistor including the first semiconductor pattern disposed on the first inorganic layer and a first gate overlapping the active of the first semiconductor pattern and disposed on the second inorganic layer;

an upper electrode overlapping the first gate and disposed on the third inorganic layer; and the second transistor including the second semiconductor pattern disposed on the fourth inorganic layer and a second gate overlapping the active of the second semiconductor pattern and disposed on the fifth inorganic layer, wherein the first semiconductor pattern includes polysilicon, and the second semiconductor pattern includes an oxide semiconductor.

6. The display device of claim 5, wherein:

the first connection electrode is disposed on the sixth inorganic layer; and the inorganic layers have the sub-valley hole defined thereon which exposes the fourth inorganic layer by penetrating from the sixth inorganic layer to the fifth inorganic layer.

7. The display device of claim 6, wherein the first organic layer is disposed in the sub-valley hole and in contact with the fourth inorganic layer.

8. The display device of claim 6, wherein the first pixel circuit further comprises a light blocking pattern overlapping the first semiconductor pattern, and disposed between the lower inorganic layer and the first inorganic layer.

9. The display device of claim 1, wherein the valley hole is obtained by removing a portion of the inorganic layers from an inorganic layer in contact with the first organic layer to an inorganic layer in contact with the lower inorganic layer.

10. The display device of claim 1, wherein:

the first light emitting element and the second light emitting element each comprise a first electrode, a second electrode disposed on the first electrode, and a light emitting layer disposed between the first electrode and the second electrode; and first color light generated in the first light emitting element is different from second color light generated in the second light emitting element.

11. The display device of claim 10, further comprising:

a second organic layer disposed on the first organic layer and having upper contact-holes which overlap respective first connection electrodes; and second connection electrodes disposed in the upper contact-holes connected to the respective first connection electrodes, wherein the respective first connection electrodes are connected to the semiconductor patterns by respective second connection electrodes.

12. The display device of claim 1, wherein at least some of the inorganic layers disposed on an outer side of the valley hole with respect to the pixel circuit unit is in a floating state with respect to the at least some of the inorganic layers disposed on an inner side of the valley hole with respect to the pixel circuit unit.

13. The display device of claim 1, wherein the conductive patterns comprise at least one of a scan line, a data line, or a voltage line connected to the first light emitting element and the second light emitting element.

14. A display device comprising:

a base layer;

a lower inorganic layer disposed on the base layer;

inorganic layers disposed on the lower inorganic layer and having contact-holes;

a first pixel including a first pixel circuit and a first light emitting element, the first pixel circuit including first semiconductor patterns disposed between at least some of the inorganic layers, the first light emitting element is connected to the first pixel circuit through a first contact-hole among the contact holes and configured to emit first color light; and a second pixel including a second pixel circuit and a second light emitting element, the second pixel circuit including second semiconductor patterns disposed between at least some of the inorganic layers, the second light emitting element is connected to the second pixel circuit through a second contact-hole among the contact holes and configured to emit second color light different from the first color light, wherein the first pixel and the second pixel are included in a pixel circuit unit, a valley hole from an upper surface of the inorganic layers and through at least some of the inorganic layers does not overlap the contact-holes in a plan view, the valley hole borders the pixel circuit unit, the first pixel circuit includes a first transistor and a second transistor, and a sub-valley hole is disposed between the first transistor and the second transistor.

15. The display device of claim 14, further comprising an organic layer disposed between the inorganic layers and the first and second light emitting elements, wherein the valley hole exposes the lower inorganic layer, the organic layer is disposed in the valley hole, and the organic layer is in contact with the lower inorganic layer.

16. The display device of claim 14, wherein at least some of the inorganic layers disposed on an outer side of the valley hole with respect to the pixel circuit unit is in a floating state with respect to the at least some of the inorganic layers on an inner side of the valley hole with respect to the pixel circuit unit.

17. The display device of claim 14, wherein the valley hole surrounds the pixel circuit unit.

18. A display device comprising:

a base layer;

a lower inorganic layer disposed on the base layer;

inorganic layers disposed on the lower inorganic layer;

a first unit pixel including first pixels configured to emit light of different colors, each of the first pixels including a first pixel circuit and a first light emitting element;

a second unit pixel including second pixels configured to emit light of different colors, each of the second pixels including a second pixel circuit and a second light emitting element;

a first valley hole which is obtained by removing at least a portion of inorganic layers overlapping first pixel circuits, and which borders the first unit pixel; and a second valley hole which is obtained by removing at least a portion of inorganic layers overlapping second pixel circuits is removed, and which borders the second unit pixel, wherein a shape of the first valley hole and a shape of the second valley hole are symmetrical in a plan view, the first pixel circuit includes a first transistor and a second transistor, and a sub-valley hole is disposed between the first transistor and the second transistor.

19. The display device of claim 18, wherein:

the first valley hole and the second valley hole expose the lower inorganic layer; and at least some of the inorganic layers disposed on an outer side of the first valley hole with respect to the first unit pixel are in a floating state with respect to the at least some of the inorganic layers disposed on an inner side of the second valley hole with respect to the second unit pixel.

20. The display device of claim 18, wherein the first valley hole surrounds the first unit pixel; and the second valley hole surrounds the second unit pixel.

* * * * *